(12) United States Patent
Kim et al.

(10) Patent No.: US 11,526,218 B2
(45) Date of Patent: Dec. 13, 2022

(54) PEN INPUT DEVICE WITH BATTERY AND OPERATING METHOD THEREOF

(71) Applicant: Samsung Electronics Co., Ltd., Gyeonggi-do (KR)

(72) Inventors: Dongwoo Kim, Gyeonggi-do (KR); Minsoo Kim, Gyeonggi-do (KR); Siho Kim, Gyeonggi-do (KR); Jiwoo Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 157 days.

(21) Appl. No.: 16/978,915

(22) PCT Filed: Aug. 6, 2020

(86) PCT No.: PCT/KR2020/010428
§ 371 (c)(1),
(2) Date: Sep. 8, 2020

(87) PCT Pub. No.: WO2021/025500
PCT Pub. Date: Feb. 11, 2021

(65) Prior Publication Data
US 2022/0197410 A1 Jun. 23, 2022

(30) Foreign Application Priority Data

Aug. 6, 2019 (KR) .................. 10-2019-0095793

(51) Int. Cl.
*G06F 3/0354* (2013.01)
*H02J 7/00* (2006.01)
(Continued)

(52) U.S. Cl.
CPC .......... *G06F 3/03545* (2013.01); *G06F 3/038* (2013.01); *H02J 7/007194* (2020.01);
(Continued)

(58) Field of Classification Search
CPC ................ G06F 3/03545; G06F 3/038; G06F 2203/0384; H02J 7/007194; H05K 1/181; H05K 5/0039; H05K 2201/10151
See application file for complete search history.

(56) References Cited

U.S. PATENT DOCUMENTS

2003/0095726 A1* 5/2003 Kia .................... G06V 30/1444
382/313
2009/0314552 A1 12/2009 Underwood et al.
(Continued)

FOREIGN PATENT DOCUMENTS

EP         3 226 110        10/2017
KR     1020120119610       10/2012
(Continued)

OTHER PUBLICATIONS

English machine translation of WO 2017110338 A1. (Year: 2017).*
(Continued)

*Primary Examiner* — Stephen G Sherman
(74) *Attorney, Agent, or Firm* — The Farrell Law Firm, P.C.

(57) ABSTRACT

A pen input device is provided, including a housing including a front opening and a rear opening; a pen input generator including a pen tip disposed in the front opening, the pen input generator generating a position signal and a pen pressure signal of the pen input device; a battery; a PCB; a support on which at least a part of the pen input generator, the battery, and the PCB are disposed; a conductive member electrically connecting the PCB and the battery; a buffer disposed in the rear opening; and a polymer that fills in an inner space of the housing. The support includes a support plate extended in a direction toward the rear opening from the front opening of the housing, and a first partition, a
(Continued)

second partition, and a third partition, which protrude from the support plate and are sequentially spaced.

20 Claims, 15 Drawing Sheets

(51) Int. Cl.
  *G06F 3/038* (2013.01)
  *H05K 1/18* (2006.01)
  *H05K 5/00* (2006.01)
(52) U.S. Cl.
  CPC ............ *H05K 1/181* (2013.01); *H05K 5/0039* (2013.01); *G06F 2203/0384* (2013.01); *H05K 2201/10151* (2013.01)

(56) References Cited

U.S. PATENT DOCUMENTS

| | | | |
|---|---|---|---|
| 2011/0175854 A1* | 7/2011 | Lien | G06F 3/03545 345/179 |
| 2012/0268429 A1 | 10/2012 | Lee et al. | |
| 2014/0078116 A1* | 3/2014 | Mercea | G06F 3/03545 345/179 |
| 2014/0340326 A1* | 11/2014 | Kameyama | G06F 3/03545 345/173 |
| 2015/0116291 A1 | 4/2015 | Leung et al. | |
| 2017/0010697 A1 | 1/2017 | Jiang et al. | |
| 2017/0277286 A1 | 9/2017 | Chiu et al. | |
| 2017/0285775 A1 | 10/2017 | Park et al. | |

FOREIGN PATENT DOCUMENTS

| | | | |
|---|---|---|---|
| KR | 1020140095394 | 8/2014 | |
| KR | 1020170030338 | 3/2017 | |
| KR | 1020170112566 | 10/2017 | |
| WO | WO 2015/061766 | 4/2015 | |
| WO | WO-2017110338 A1 * | 6/2017 | ............ G06F 1/1643 |

OTHER PUBLICATIONS

International Search Report dated Oct. 29, 2020 issued in counterpart application No. PCT/KR2020/010428, 8 pages.
European Search Report dated Aug. 2, 2022 issued in counterpart application No. 20849025.0-1224, 9 pages.

* cited by examiner

PEN INPUT DEVICE WITH BATTERY AND OPERATING METHOD THEREOF

PRIORITY

This application is a National Phase Entry of PCT International Application No. PCT/KR2020/010428 which was filed on Aug. 6, 2020, and claims priority to Korean Patent Application No. 10-2019-0095793, which was filed on Aug. 6, 2019, the content of each of which is incorporated herein by reference.

BACKGROUND

1. Field

The disclosure relates generally to a pen input device including a battery and to an operating method of the pen input device.

2. Related Art

With the advent of smart devices, such as smartphones and tablets, it is often difficult to find paper and pens in everyday life. The use of smart devices is also increasing as the desire for a paperless environment is increasing in consideration of the environment and improving work efficiency. Accordingly, paper and pens are being replaced by smart devices and pen input devices (e.g., stylus pens). As the pen input device, which was previously used only for specific purposes, becomes more sophisticated and increases in functionality, the role of the pen input device is expanding to replace paper and pen.

The pen input device may be equipped with a battery. However, when an external impact occurs due to the pen input device being dropped or when an inadvertent external pressure is applied to the pen input device, problems may occur in the battery and related power system. In addition, the battery may catch fire or explode due to an abnormality of the battery or the power system, resulting in injury to the user.

SUMMARY

The disclosure has been made to address the above-mentioned problems and disadvantages, and to provide at least the advantages described below.

Accordingly, an aspect of the disclosure is to provide a pen input device capable of protecting a battery from an external impact or external pressure.

Another aspect of the disclosure is to provide a pen input device capable of protecting a user from an explosion of a battery.

Another aspect of the disclosure is to provide a method of operating a pen input device that prevents an explosion of a battery.

The technical problems to be solved in this disclosure are not limited to the mentioned above, and other technical problems not mentioned can be clearly understood by those skilled in the art from the following description.

In accordance with an aspect of the disclosure, a pen input device may is provided, which includes a tubular housing including a front opening and a rear opening disposed opposite to each other; a pen input generator including a pen tip disposed in the front opening, the pen input generator generating a position signal and a pen pressure signal of the pen input device; a battery; a printed circuit board (PCB) disposed between the pen input generator and the battery the PCB being electrically connected to the pen input generator and the battery; a support on which at least a part of the pen input generator, the battery, and the PCB are disposed; a conductive member electrically connecting the PCB and the battery; a buffer disposed in the rear opening; and a polymer that fills in an inner space of the housing. The support includes a support plate extended in a direction toward the rear opening from the front opening of the housing, and a first partition, a second partition, and a third partition, which protrude from the support plate and are sequentially spaced in the direction. The pen input generator is combined with the first partition, the PCB is disposed between the first partition and the second partition, and the battery is disposed between the second partition and the third partition. A stepped structure is formed on an inner surface of the housing between the third partition and the buffer and prevents the buffer from moving toward the third partition. The conductive member penetrates an opening formed in the second partition.

Various respective aspects and features of the invention are defined in the appended claims. Combinations of features from the dependent claims may be combined with features of the independent claims as appropriate and not merely as explicitly set out in the claims.

Furthermore, one or more selected features of any one embodiment described in this disclosure may be combined with one or more selected features of any other embodiment described herein, provided that the alternative combination of features at least partially alleviates the one or more technical problem discussed in this disclosure or at least partially alleviates a technical problem discernable by the skilled person from this disclosure and further provided that the particular combination or permutation of embodiment features thus formed would not be understood by the skilled person to be incompatible.

Two or more physically distinct components in any described example implementation of this disclosure may alternatively be integrated into a single component where possible, provided that the same function is performed by the single component thus formed. Conversely, a single component of any embodiment described in this disclosure may alternatively be implemented as two or more distinct components to achieve the same function, where appropriate.

It is an aim of certain embodiments of the invention to solve, mitigate or obviate, at least partly, at least one of the problems and/or disadvantages associated with the prior art. Certain embodiments aim to provide at least one of the advantages described below.

The pen input device according to various embodiments of the present invention can smoothly perform a function of utilizing battery power by protecting a battery or a related power system from an external impact or external pressure. The pen input device according to various embodiments of the present invention can reduce an injury to a user by buffering an explosion of a battery. The pen input device operating method according to various embodiments of the present disclosure can prevent a battery explosion in advance based on a temperature of a battery.

In addition, other features, advantages, and effects obtained or predicted from various embodiments of the present invention will be described explicitly or implicitly in the detailed description of the embodiments.

BRIEF DESCRIPTION OF DRAWINGS

The above and other aspects, features, and advantages of certain embodiments of the disclosure will be more apparent from the following description taken in conjunction with the accompanying drawings; in which.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but are merely used to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
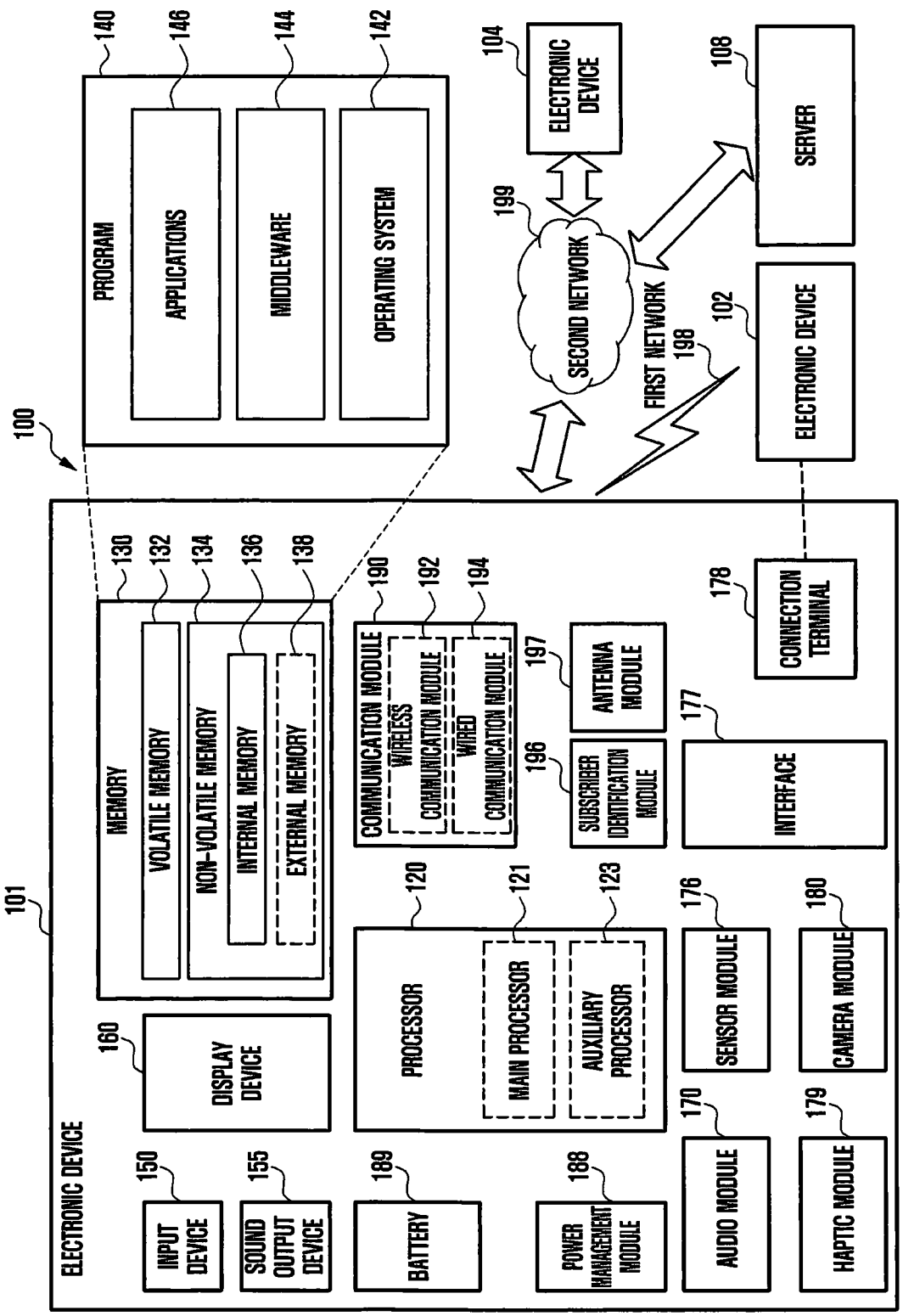
FIG. 1 is a block diagram illustrating an electronic device in a network environment according to an embodiment.

FIG. 1 illustrates an electronic device 101 in a network environment 100 according to an embodiment.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, an audio output module 155, a display module 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the sensor module 176 or the camera module 180) of the components may be omitted from the electronic device 101, or one or more other components may be added in the electronic device 101. In some embodiments, some (e.g., the sensor module 176, the camera module 180, or the antenna module 197) of the components may be implemented as single integrated circuitry. For example, the sensor module 176 (e.g., a fingerprint sensor, an iris sensor, or an illuminance sensor) may be implemented as embedded in the display module 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record, and the receiver may be used for an incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the audio output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (a) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above. Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The tem "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101), For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
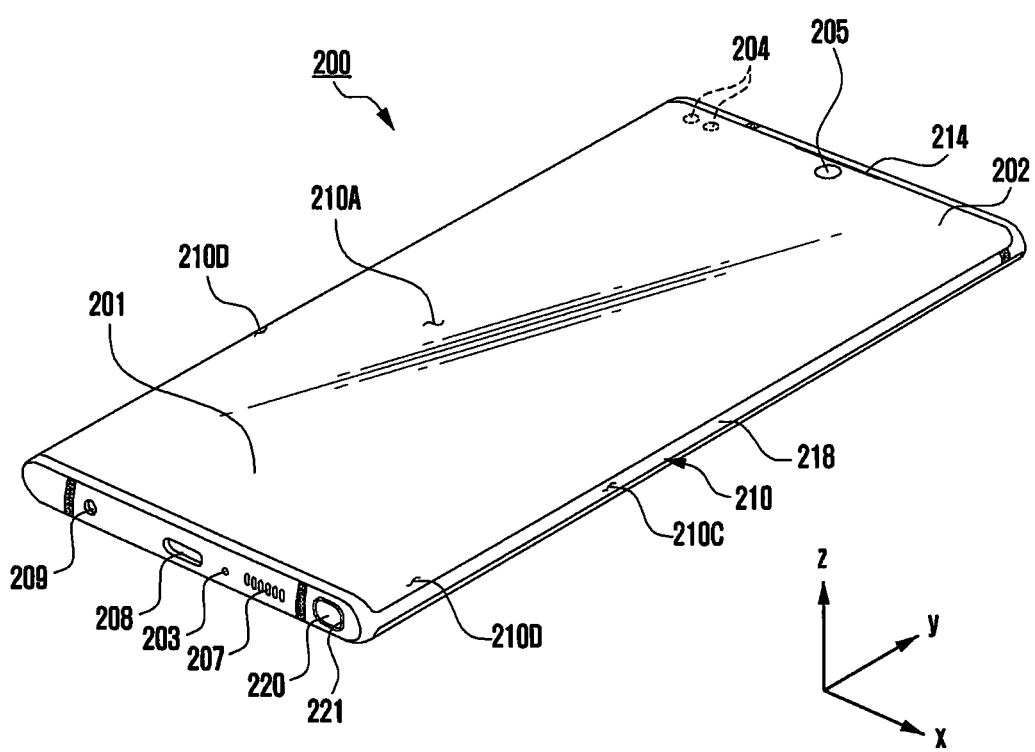
FIG. 2A is a perspective view illustrating a front surface of a mobile electronic device according to an embodiment.

FIG. 2A is a perspective view illustrating a front surface of a mobile electronic device 200 according to an embodiment.

Figure 2B:
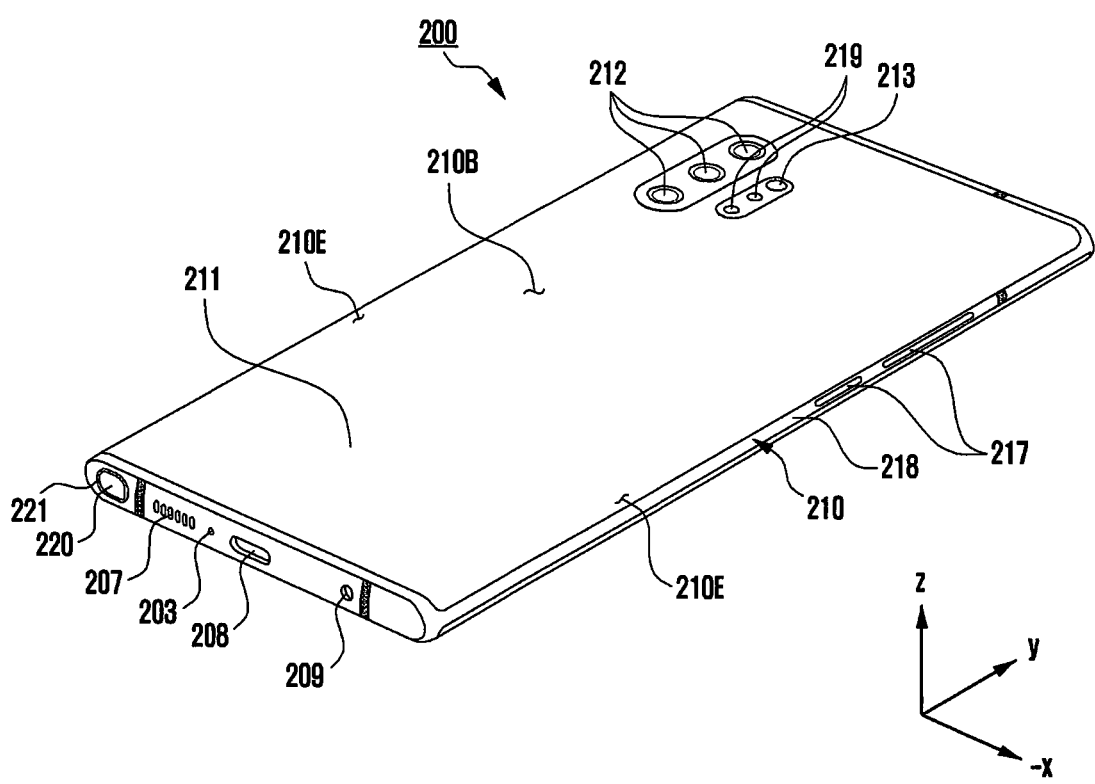
FIG. 2B is a perspective view illustrating a rear surface of the mobile electronic device of FIG. 2A according to an embodiment.

FIG. 2B is a perspective view illustrating a rear surface of the electronic device 200 of FIG. 2A according to an embodiment.

Referring to FIGS. 2A and 2B, according to an embodiment, an electronic device 200 may include a housing 210 that includes a front surface 210A, a rear surface 210B, and a lateral surface 210C that surrounds a space between the front surface 210A and the rear surface 210B. According to another embodiment, the housing 210 may refer to a structure that forms at least a part of the front surface 210A, the rear surface 210B, and the lateral surface 210C. According to an embodiment, the front surface 210A may be formed of a front plate (or first plate) 202 (e.g., a glass plate or polymer plate coated with a variety of coating layers) at least a part of which is substantially transparent. The rear surface 210B may be formed of a rear plate (or second plate) 211 which is substantially opaque. The rear plate 211 may be formed of, for example, coated or colored glass, ceramic, polymer, metal (e.g., aluminum, stainless steel (STS), or magnesium), or any combination thereof. The lateral surface 210O may be formed of a lateral bezel structure (or "lateral member") 218 which is combined with the front plate 202 and the rear plate 211 and includes a metal and/or polymer. In some embodiments, the rear plate 211 and the lateral bezel structure 218 may be integrally formed and may be of the same material (e.g., a metallic material such as aluminum).

In the shown embodiment, the front plate 202 may include two first regions 210D disposed at long edges thereof, respectively, and bent and extended seamlessly from the front surface 210A toward the rear plate 211. In the shown embodiment, the rear plate 211 may include two second regions 210E disposed at long edges thereof, respectively, and bent and extended seamlessly from the rear surface 210B toward the front plate 202 (refer to FIG. 2B). In various embodiments, the front plate 202 (or the rear plate 211) may include only one of the first regions 210D or only one of the second regions 210E. In various embodiments, the first regions 210D or the second regions 210E may be omitted in part. In the embodiments, when viewed from a lateral side of the electronic device 200, the lateral bezel structure 218 may have a first thickness (or width) on a lateral side where one of the first regions 210D or one of the second regions 210E is not included, and may have a second thickness, being less than the first thickness, on another lateral side where one of the first regions 210D or one of the second regions 210E is included.

According to an embodiment, the electronic device 200 may include at least one of a display 201, audio modules 203, 207 and 214, sensor modules 204 and 219, camera modules 205, 212 and 213, key input devices 217, a pen input device 220, and connector holes 208 and 209. In various embodiments, the electronic device 200 may omit at least one (e.g., the key input devices 217) of the above components, or may further include other components (e.g., a fingerprint sensor or a light emitting device)

The display 201 may be exposed through a substantial portion of the front plate 202, for example. In various embodiments, at least a part of the display 201 may be exposed through the front plate 202 that forms the front surface 210A and the first regions 210D. In various embodiments, outlines (i.e., edges and corners) of the display 201 may have substantially the same form as those of the front plate 202. In another embodiment, the spacing between the outline of the display 201 and the outline of the front plate 202 may be substantially unchanged in order to enlarge the exposed area of the display 201.

In another embodiment, a recess or opening may be formed in a portion of a display area of the display 201 to accommodate or to be aligned with at least one of the audio modules (e.g., the audio module 214), the sensor module 204, and the camera module 205. In another embodiment, at least one of the audio modules (e.g., the audio module 2:1.4), the sensor module 204, and the camera module 205 may be disposed on the back of the display area of the display 201. In another embodiment, the display 201 may be combined with, or adjacent to, a touch sensing circuit, a pressure sensor capable of measuring the touch strength (pressure), and/or a digitizer for detecting a stylus pen. In various embodiments, at least a part of the sensor modules 204 and/or at least a part of the key input devices 217 may be disposed in one of the first regions 210D and/or one of the second regions 2:1.0E.

The audio modules 203, 207 and 214 may correspond to a microphone hole (e.g., the audio modules 203) and speaker holes (e.g., the audio module 207 and the audio module 214). The microphone hole may contain a microphone disposed therein for acquiring external sounds and, in a case, contain a plurality of microphones to sense a sound direction. The speaker holes may be classified into an external speaker hole (e.g., the audio module 207) and a call receiver hole (e.g., the audio module 214). In various embodiments, the microphone hole and the speaker holes may be implemented as a single hole, or a speaker (e.g., a piezo speaker) may be provided without the speaker holes.

The sensor modules 204 and 219 may generate electrical signals or data corresponding to an internal operating state of the electronic device 200 or to an external environmental condition. The sensor modules 204 and 219 may include a first sensor module (e.g., the sensor module 204) (e.g., a proximity sensor) and/or a second sensor module (e.g., a fingerprint sensor) disposed on the first surface 210A of the housing 210, and/or a third sensor module (e.g., the sensor module 219) (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an IR sensor, a biometric sensor, a temperature sensor, a humidity sensor, or an illuminance sensor (e.g., the sensor module 204).

The camera modules 205, 212 and 213 may include a first camera device (e.g., the camera module 205) disposed on the first surface 210A of the electronic device 200, and a second camera device (e.g., the camera module 212) and/or a flash (e.g., the camera module 213) disposed on the second surface 210B. The first camera device and the second camera device may include one or more lenses, an image sensor, and/or an image signal processor. The flash may include, for example, a light emitting diode or a xenon lamp. Two or more lenses (infrared cameras, wide angle and telephoto lenses) and image sensors may be disposed on one side of the electronic device 200.

The key input devices 217 may be disposed on the lateral surface 210C of the housing 210. The mobile electronic device 200 may not include some or all of the key input devices 217 described above, and the key input devices 217 which is not included may be implemented in another form such as a soft key on the display 201. The key input devices 217 may include the sensor module disposed on the second surface 210B of the housing 210.

The light emitting device may be disposed on the first surface 210A of the housing 210. For example, the light emitting device may provide status information of the electronic device 200 in an optical form. The light emitting device may provide a light source associated with the operation of the camera module 205. The light emitting device may include, for example, a light emitting diode (LED), an IR LED, or a xenon lamp.

The connector holes 208 and 209 may include a first connector hole (e.g., the connector hole 208) adapted for a connector (e.g., a USB connector) for transmitting and receiving power and/or data to and from an external electronic device, and/or a second connector hole (e.g., the connector hole 209) adapted for a connector (e.g., an earphone jack) for transmitting and receiving an audio signal to and from an external electronic device.

The pen input device 220 (e.g., a stylus pen) may be inserted into or removed from the housing 210 through a hole 221 formed in a surface of the housing 210, and may include a button for assisting an easy removal. The pen input device 220 may have a built-in resonant circuit to interwork with an electromagnetic induction panel included in the electronic device 200. The pen input device 220 may be implemented in a manner of an electromagnetic induction.

The pen input device 220 may be implemented in a manner of an electro-magnetic resonance (EMR), active electrical stylus (AES), or electric coupled resonance (ECR).

The above-described method of inserting the pen input device 220 into an inner space of the housing 210 is exemplary only, and various other methods for attaching and detaching the pen input device 220 to and from the electronic device 200 may be used. For example, in addition to the inner space, the electronic device 200 may have a mounting region or space (e.g., a mounting structure formed on an outer surface of the housing) that allows the pen input device 220 to be attached (or mounted). Using a magnet, the pen input device 220 may be attached to the housing 210 of the electronic device 200. Various operations performed when the pen input device 220 is located in the inner space of the housing 210 may be similarly applied to any case where the pen input device 220 is attached to the mounting area in various embodiments.

Figure 3:
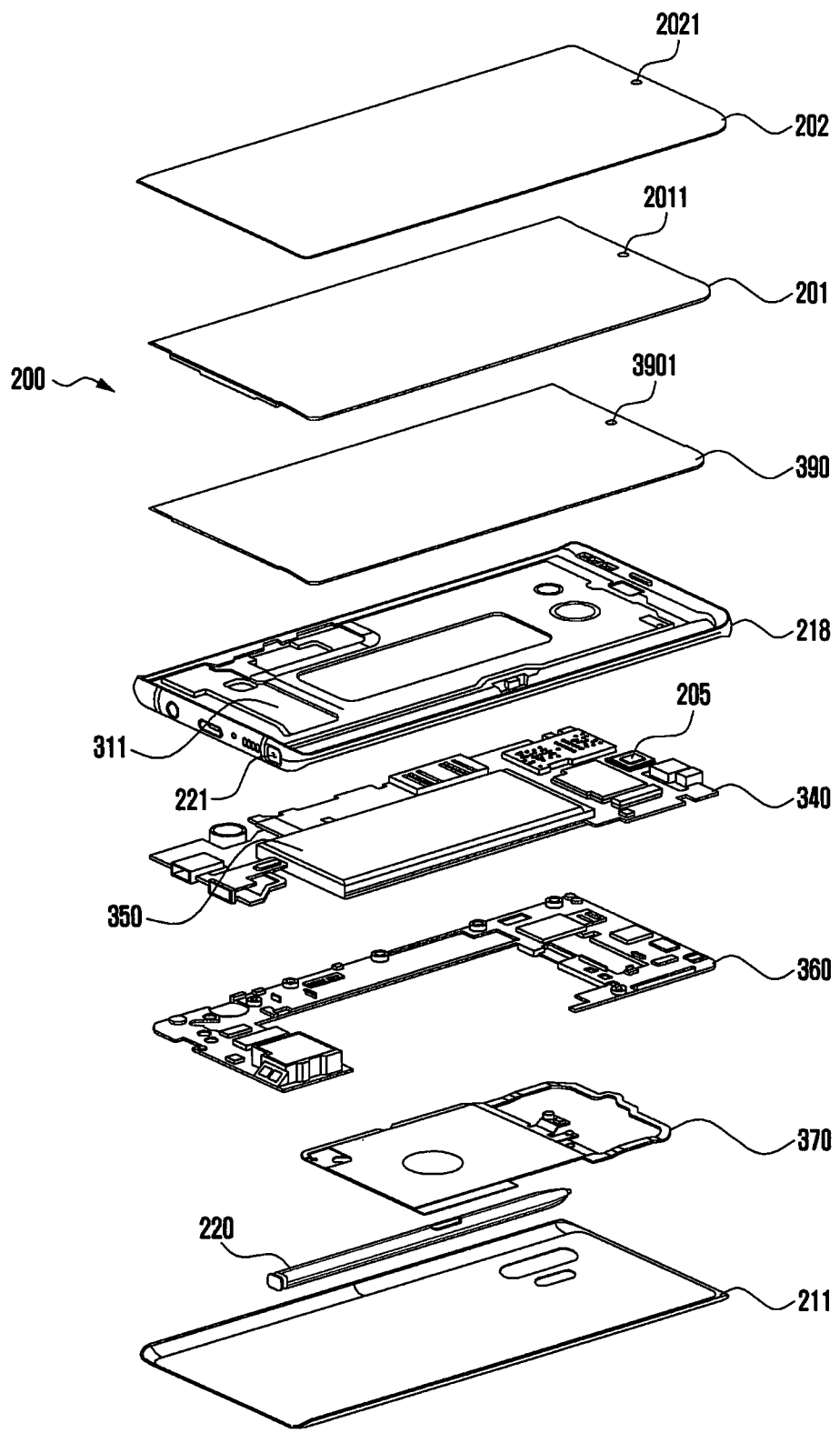
FIG. 3 illustrates an exploded perspective view of the mobile electronic device of FIG. 2A according to an embodiment.

FIG. 3 illustrates an exploded perspective view of the electronic device 200 of FIG. 2A according to an embodiment.

Referring to FIG. 3, the electronic device 200 includes the lateral bezel structure 218, a first support member 311 (e.g., a bracket), the front plate 202, the display 201, an electromagnetic induction panel 390, a PCB 340, a battery 350, a second support member 360 (e.g., a rear case), an antenna 370, the pen input device 220, and the rear plate 211. Alternatively, the electronic device 200 may omit at least one of the above components (e.g., the first support member 311 or the second support member 360) or may include another component. Some components of the electronic device 200 may be the same as or similar to those of the electronic device 200 shown in FIG. 2A or FIG. 2B, thus descriptions thereof are omitted below.

The electromagnetic induction panel 390 (e.g., a digitizer) may detect an input of the pen input device 220. The electromagnetic induction panel 390 may include a PCB (e.g., a flexible PCB (FPCB)) and a shielding sheet. The shielding sheet may prevent interference between components included in the electronic device 200 (e.g., the display 201, the PCB 340, the electromagnetic induction panel 390, etc.) due to electromagnetic field generated from such components. Blocking the electromagnetic field generated from the components, the shielding sheet may allow the input of the pen input device 220 to be accurately transmitted to a coil included in the electromagnetic induction panel 390. The electromagnetic induction panel 390 includes an opening 3901 formed at a portion corresponding to an optical sensor (e.g., the camera module 205 or the biometric sensor) disposed in the electronic device 200.

In certain implementations of the pen input device, the electromagnetic induction panel 390 may be omitted. For example, when the pen input device is implemented to generate a signal using the power of a battery included therein, the electromagnetic induction panel 390 may be omitted.

The first support member 311 is disposed inside the electronic device 200 and may be connected to, or integrated with, the lateral bezel structure 218. The first support member 311 may be formed of a metallic material and/or a non-metal (e.g., polymer) material. The first support member 311 may be combined with the display 201 at one side thereof and also combined with the PCB 340 at the other side thereof.

On the PCB 340, a processor, a memory, and/or an interface may be mounted. The processor may include a CPU, an AP, a GPU, an ISP, a sensor hub processor, or a CP.

The memory may include volatile memory or non-volatile memory.

The interface may include an HDMI, a USB interface, an SD card interface, and/or an audio interface. The interface may electrically or physically connect the electronic device 200 with an external electronic device and may include a USB connector, an SD card/multimedia card (MMC) connector, and/or an audio connector.

The battery 350 supplies power to at least one component of the electronic device 200, and may include a non-rechargeable primary battery, a rechargeable secondary battery, and/or a fuel cell. At least a part of the battery 350 may be disposed on substantially the same plane as the PCB 340. The battery 350 may be integrally disposed inside the electronic device 200, and may be detachably disposed from the electronic device 200.

The antenna 370 may be disposed between the rear plate 211 and the battery 350. The antenna 370 may include a near field communication (NFC) antenna, a wireless charging antenna, and/or a magnetic secure transmission (MST) antenna. The antenna 370 may perform short-range communication with an external device, or transmit and receive power required for charging wirelessly. Alternatively, an antenna structure may be formed by a part or combination of the lateral bezel structure 218 and/or the first support member 311.

The second support member 360 may be disposed between the first support member 311 and the rear plate 211. The second support member 360 may be combined with the first support member 311 via a joint member such as a bolt. At least a portion of the PCB 340 may be disposed between the first support member 311 and the second support member 360, and the second support member 360 may cover the PCB 340 to protect.

The display 201 includes an opening 2011 formed at a portion corresponding to an optical sensor disposed in the electronic device 200. The optical sensor may receive external light through a portion 2021 of the front plate 202, the opening 2011 of the display 201, and the opening 3901 of the electromagnetic induction panel 390, all of which are aligned with each other. Alternatively, the opening 2011 of the display 201 may be replaced with a substantially transparent region formed by changing the pixel structure and/or wiring structure.

The pen input device 220 may include a battery (e.g., a lithium ion battery). The pen input device 220 may protect the battery or a related power system from external impact or external pressure. The pen input device 220 may also buffer the explosion of the battery to reduce user injury. The pen input device 220 may prevent a battery explosion in advance based on the temperature of the battery.

Figure 4:
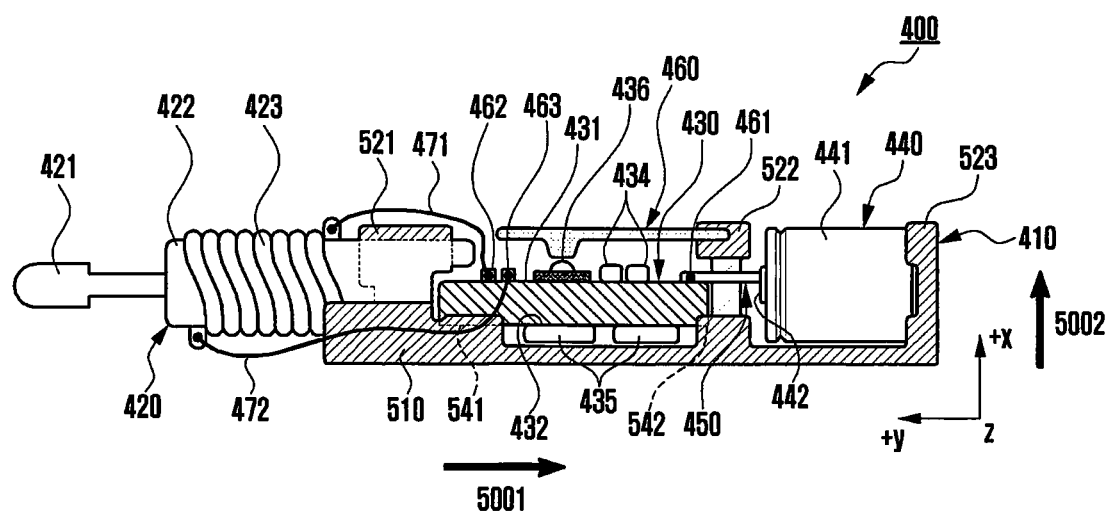
FIG. 4 illustrates a cross-sectional view of an input device assembly included in a pen input device according to an embodiment.
Figure 5:
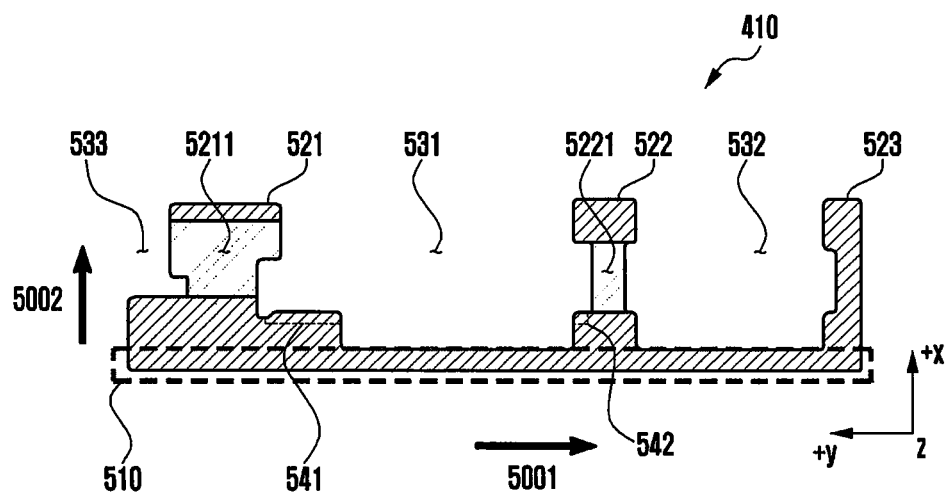
FIG. 5 illustrates a cross-sectional view of a holder of FIG. 4 according to an embodiment.

FIG. 4 illustrates a cross-sectional view of an input device assembly 400 included in the pen input device 220 of FIG. 3 according to an embodiment. FIG. 5 illustrates a cross-sectional view of a support 410 of FIG. 4 according to an embodiment.

Referring to FIG. 4, the input device assembly 400 (or input device structure) includes the support 410, a pen input generator 420, a PCB 430, and a battery 440. The pen input generator 420, the PCB 430, and the battery 440 may be disposed on the support 410. The PCB 430 may be disposed between the pen input generator 420 and the battery 440. The pen input generator 420, the PCB 430, and/or the battery 440 may be combined with the support 410 through various bonding members such as adhesive or bolts.

The pen input generator 420 (e.g., a pen input generating structure, a pen input generating assembly, or a pen input generating unit) includes a pen tip 421. The pen input generator 420 may serve as a pointer that indicates a location (or coordinate) of the pen input device 220. The pen input generator 420 may serve as a pen pressure detector that detects a pen pressure (or pressure sensitivity) (e.g., the degree of a writing press to express a specific line thickness). When a user input is performed on the screen of the electronic device 200 of FIG. 2A with the pen input device 220 of FIG. 3, the pen input generator 420 may indicate a point where a position signal and a pen pressure signal for the screen are generated. The electronic device 200 may receive the position signal and the pen pressure signal generated by the pen input generator 420 through the screen, thereby recognizing the position (coordinate) and pen pressure of the user input on the screen. The pen input generator 420 may also generate an angle signal, and the electronic device 200 may receive the angle signal from the pen input generator 420 through the screen and thereby recognize an angle of the pen input device 200 with respect to the screen. The pen input generator 420 may be implemented in various ways that can generate signals (e.g., the position signal, the pen pressure signal, and/or the angle signal) related to a user input on the screen. The pen input generator 420 may be referred to as any other term such as 'a pen tip sensor'.

The pen input generator 420 may generate, when a user input is performed on the screen of the electronic device 200 of FIG. 2A using the pen input device 220 of FIG. 3, signals (e.g., the position signal, the pen pressure signal, and/or the angle signal) related to the user input by receiving energy from the screen. For example, the pen input generator 420 may operate in an electromagnetic induction manner (e.g., EMR manner), and may include a core 422 (e.g., magnetic material or ferrite) and a coil 423 disposed on the core 422. The electronic device 200 may supply alternating current to the electromagnetic induction panel 390 (e.g., a magnetic field generating device such as a digitizer) of FIG. 3, and the electromagnetic induction panel 390 may form a magnetic field on a screen (e.g., a device composed of the front plate 202, the display 201, and the electromagnetic induction panel 390 in FIG. 3). When the pen input generator 420 is close to the screen, current may flow through the coil 423 of the pen input generator 420 by electromagnetic induction. The signals (e.g., the position signal, the pen pressure signal, and/or the angle signal) related to the user input on the screen may be generated by the pen input generator 420 using energy supplied from the electromagnetic induction panel 390.

The pen input generator 420 may generate the signals (e.g., the position signal, the pen pressure signal, and/or the angle signal) related to the user input on the screen by using the power of the battery 440 included in the input device assembly 400. For example, using the power of the battery 440, the pen input generator 420 may generate an electrostatic signal (e.g., a signal distinct from a user's hand or finger) regarding the user input (e.g., AES manner). The pen input generator 420 may transmit or receive various communication signals such as device identification information about the electronic device 200 of FIG. 2A through the screen.

When the pen input generator 420 generates an electrostatic signal by using the power of the battery 440, the electromagnetic induction panel 390 of FIG. 3 may be omitted. The pen input generator 420 may be implemented in various other manners to generate the signals (related to the user input on the screen.

When the user input is performed on the screen of the electronic device 200 of FIG. 2A with the pen input device 220 of FIG. 3, the pen tip 421 may move in a direction toward the battery 440 and then press a pen pressure switch disposed inside the input device assembly 400. The input device assembly 400 may generate a pen pressure signal based on a signal detected by the pen pressure switch.

When the user input is performed on the screen of the electronic device 200 of FIG. 2A with the pen input device 220 of FIG. 3, a change in capacitance may occur, and the pen pressure signal may be generated based on the change in capacitance. The change in capacitance may occur when the pen tip 421 moves in the direction toward the battery 440.

Components 434 and 435 that support the pen input device 220 to perform a charging function, a Components 434 and 435 may include a temperature sensor or a motion sensor. The positions of the components 434 and 435 are not limited to the example illustrated in FIG. 4.

The PCB 430 may be electrically connected to the pen input generator 420. The pen input generator 420 may include the coil 423 that is implemented in an electromagnetic induction manner and extended from one end to the other end. The one end of the coil 423 may be electrically connected to one contact portion 462 (e.g., a land or a copper foil pad) on the PCB 430 through one electrical path 471 (e.g., a conductive wire or a conductive cable). The other end of the coil 423 may be electrically connected to another contact portion 463 on the PCB 430 through another electrical path 472. A first communication controller configured to perform first wireless communication with the electronic device 200 of FIG. 2A through the pen input generator 420 may be mounted on the PCB 430, The first communication controller may be electrically connected to the pen input generator 420 through the electrical paths 471 and 472. For example, when the user input is performed on the screen of the electronic device 200 of FIG. 2A with the pen input device 220 of FIG. 3, the first communication controller may transmit radio frequency signals related to the position signal, the pen pressure signal, and/or the angle signal to the screen of the electronic device 200 through the pen input generator 420.

The PCB 430 may include a rigid PCB, an FPCB, or a rigid-FPCB (RFPCB).

The battery 440 may supply power to at least one component of the pen input device 220. The battery 440 may include a rechargeable secondary battery. The pen input device 220 may include an active area associated with a charging function, a communication function, or a sensor function, and the active area may be driven using the power of the battery 440.

The battery 440 may include an electrode assembly having a structure provided by winding a positive electrode plate, a negative electrode plate, and a separator to roll together. The battery 440 may be implemented in the form of a jelly roll. By placing the electrode assembly in the inner space of a pouch 441, injecting electrolyte, and sealing with a cover 442, the electrode assembly may be disposed with the electrolyte in the inner space of the pouch 441.

The pouch 441 may be a cylindrical pouch, and the electrode assembly may be disposed in a wound form within the cylindrical pouch. The pouch 441 may be formed in various other forms. The pouch 441 of the battery 440, which is a member having the inner space for accommodating the electrode assembly and the electrolyte, may be referred to as other terms such as 'can', 'case', 'housing', or 'exterior material'. The pouch 441 may be formed of a metal such as aluminum or a non-metal such as polymer, and may be substantially rigid. The pouch 441 may also be formed of a flexible material.

The battery 440 may convert chemical energy of the positive electrode plate and the negative electrode plate into electrical energy, and may supply power to the PCB 430 by being electrically connected to the PCB 430 through a conductive member 450. The conductive member 450 may be extended out of the pouch 441 from the electrode assembly, and may be referred to as an element included in the battery 440 according to various embodiments. The conductive member 450 may include a positive electrode tab electrically connected to the positive electrode plate, and a negative electrode tab electrically connected to the negative electrode plate.

The battery 440 may be a lithium ion battery. For example, the positive electrode plate of the electrode assembly may include a positive electrode substrate and a first mixture coated on the positive electrode substrate. The battery capacity and voltage may be determined depending on the positive electrode plate. The first mixture may include a positive electrode active material, a conductive agent, and a binder. The positive electrode active material is a material (e.g., nickel cobalt manganese oxide (NCM), nickel cobalt aluminum oxide (NCA), lithium cobalt oxide (LCO), etc.) involved in the electrode reaction, the conductive agent is a material for enhancing conductivity, and the binder can increase a binding force between the positive electrode active material and the conductive agent. The positive electrode substrate may be a plate or layer (e.g., aluminum (Al) foil) containing a metal such as aluminum, and the positive electrode active material may include lithium-based oxide as a main component. The negative electrode plate of the electrode assembly may include, for example, a negative electrode substrate and a second mixture coated on the negative electrode substrate. The second mixture may include a negative electrode active material, a conductive agent, and a binder. The negative electrode substrate may be a plate or layer (e.g., copper (Cu) foil) containing a metal such as copper, and the negative electrode active material may include a carbon material as a main component. The electrolyte is a medium that allows ions to move so that the reduction or oxidation reaction of the positive electrode plate or the negative electrode plate is chemically harmonized. The electrolyte may include a substance in a liquid, solid, or gel state. For example, in a charging process of the battery 440, by oxidation of the positive electrode plate and reduction of the negative electrode plate, lithium ions come out of the positive electrode plate, pass through the electrolyte, and move to the negative electrode plate, and electrons flow from the positive electrode plate to the negative electrode plate along a circuit (e.g., a power management controller) connected to the conductive member 450. In a discharging process of the battery 440, by reduction of the positive electrode plate and oxidation of the negative electrode plate, lithium ions come out of the negative electrode plate, pass through the electrolyte, and move to the positive electrode plate, and electrons flow from the negative electrode plate to the positive electrode plate along a circuit connected to the conductive member 450, In the discharging process, the battery 140 may convert chemical energy of the positive electrode active material of the positive electrode plate, the negative electrode active material of the negative electrode plate, and the electrolyte into electrical energy, and may supply power to the power management controller through the conductive member 450. The separator of the electrode assembly may be a separator diaphragm disposed between the positive and negative electrode plates to prevent physical contact therebetween. The separator may prevent a short between the positive and negative electrode plates, and enable movement of ions. The separator may allow the flow of charges by allowing ions to move through fine pores, and may be formed of various materials to have porosity. The separator may include at least one of polyethylene (PE) or polypropylene (PP).

The conductive member 450 may extended from one end to the other end to connect the PCB 430 and the electrode assembly of the battery 440. When the resistance of the conductive member 450 is greater than a threshold value, the voltage reaching the PCB 430 due to the electrical energy of the battery 440 may be lower than a reference voltage. Thus, it may be difficult to activate a circuit related to a function using the power of the battery 440 (e.g., power off). The length, width, and thickness of the conductive member 450 may be determined in consideration of such resistance.

One end of the conductive member 450 may be electrically connected to the electrode assembly of the battery 440, and the other end may be electrically connected to a contact portion 461 of the PCB 430. The contact portion 461 may be a copper pad or a land, and an end of the conductive member 450 may be connected to the contact portion 461 through a conductive bonding material such as solder. The conductive member 450 may be implemented in the form of an FPCB. In this case, the end of the conductive member 450 may include a first connector, and the contact portion 461 of the PCB 430 may be implemented as a second connector that can be electrically connected to the first connector.

The contact portion 461 may be disposed on a first surface 431 of the PCB 430, and the conductive member 450 may be extended straightly from the battery 440 to the contact portion 461. When there is a difference in height between one end of the conductive member 450 connected to the battery 440 and the other end connected to the contact portion 461, the conductive member 450 may be disposed in various forms, such as a curved form, other than the straightly extended form. The conductive member 450 may be extended from one end to the other end in a substantially constant cross-sectional shape. The cross-sectional shape may be various, such as circular or square. The conductive member 450 may be disposed in various other forms.

The pen input generator 420 (e.g., a pen tip sensor), the PCB 430, and the battery 440 may be organically combined with each other through the support 4:1.0 (e.g., a support member, a support component, a support part, a bracket, or a holder). Even if there is an external impact or external pressure due to a falling of the pen input device 220 or an external force applied to the pen input device 220, the support 410 can withstand it without substantial deformation (e.g., warping, bending, or breakage) because of having rigidity. The support 410 includes a support plate 510, a first partition 521 (or partition wall), a second partition 522, and/or a third partition 523. When viewed in cross section, the support plate 510 may be extended in a first direction 5001 (e.g., the negative y-axis direction) from the pen input generator 420 to the battery 440. When viewed in cross-section, each of the first partition 521, the second partition 522, and the third partition 523 may be protruded from the support plate 510 in a second direction 5002 (e.g., the x-axis direction) substantially perpendicular to the first direction 5001. The first partition 521, the second partition 522, and the third partition 523 may be spaced apart from each other in the first direction 5001, and the second partition 522 may be disposed between the first partition 521 and the third partition 523. The first partition 521, the second partition 522, and the third partition 523 may be integrally formed with the support plate 510 while being formed of the same material as the support plate 510. The support 410 may be a one-piece polymer member formed by injection molding. At least a part of the support 410 may include a metallic material.

The support 410 may have a first container 531 formed by the support plate 510, the first partition 521, and the second partition 522. The PCB 430 may be disposed in or combined with the first container 531. The PCB 430 may have a first surface 431 and a second surface 432 disposed opposite to each other. The PCB 430 may be disposed in the first container 531 so that the second surface 432 faces the support plate 510.

Referring to FIG. 5, the support 410 includes a second container 532 formed by the support plate 510, the second partition 522, and the third partition 523. The battery 440 may be disposed in or combined with the second container 532. The second partition 522 includes a second opening 5221 as a passage for electrical connection between the PCB 430 and the battery 440. The conductive member 450 may penetrate the second opening 5221 to electrically connect the PCB 430 disposed in the first container 531 and the battery 440 disposed in the second container 532.

The support 410 may have a third container 533 formed ley the support plate 510 and the first partition 521. The pen input generator 420 may be disposed in the third container 533. For example, the first partition 521 may have a first opening 5211, and the core 422 of the pen input generator 420 may be inserted into the first opening 5211. The first opening 5211 may be used as a passage for electrically connecting the pen input generator 420 and the PCB 430. An electrical path electrically connecting the pen input generator 420 and the PCB 430 may be disposed passing through the first opening 5211.

Components, for example, the support 410, the pen input generator 420, the PCB 430, the battery 440, and the conductive member 450, may be combined with each other. However, because such components are different from each other in a mass (or enter of mass) or weight, the respective components may be subjected to shaking, fluctuation, or vibration when an external impact or external pressure caused by a falling or external force occurs. Thus, the components of the input device assembly 400 may be formed in consideration of tolerances, and such tolerances may be involved in shaking, fluctuation, or vibration of each component with respect to an external impact or external pressure. Due to the external impact or external pressure, such components may be difficult to perform the same translation motion and, for example, may move (e.g., shake, fluctuate, or vibrate) in different directions or different displacements. The shaking, fluctuation, or vibration of the input device assembly 400 due to the external impact or external pressure may generate stress that can damage the components such as the pen input generator 420, the PCB 430, the battery 440, and the conductive member 450, When the external impact or external pressure occurs, the second partition 522 and the third partition 523 may reduce stress in the battery 440 and/or the conductive member 450 connecting the battery 440 and the PCB 430. In the absence of the second partition 522 or the third partition 523, the external impact or external pressure may be directly applied to the conductive member 450 or the battery 440.

The pen input generator 420 and the battery 440 are disposed opposite to each other with the PCB 430 therebetween, and the first partition 521 and the second partition 522 are disposed between the pen input generator 420 and the battery 440. This may reduce the external impact or external pressure on the battery 440 and the conductive member 450.

The second partition 522 includes a second lock structure 542 or a second engaging part or a second fixing part), and the PCB 430 may be disposed in the second lock structure 542, When the PCB 430 is disposed in the second lock structure 542 of the second partition 522, the external impact or external pressure caused by a falling or external force and delivered from the PCB 430 to the conductive member 450 or the battery 440 may be reduced or blocked. Stress due to the external impact or external pressure may substantially occur between the PCB 430 and the second lock structure 542. Even if such stress occurs between the PCB 430 and the second lock structure 542, the support 410 and the PCB 430 may have rigidity or durability that can withstand the stress.

The first partition 521 includes a first lock structure 541 (or a first engaging part or a first fixing part), and the PCB 430 may be disposed in the first lock structure 541. When the PCB 430 is disposed in the first lock structure 541 of the first partition 521, the external impact or external pressure caused by a falling or external force and delivered from the PCB 430 to the pen input generator 420 may be reduced or blocked. Stress due to the external impact or external pressure may substantially occur in between the PCB 430 and the first lock structure 541. Even if such stress occurs between the PCB 430 and the first lock structure 541, the support 410 and the PCB 430 may have rigidity or durability that can withstand the stress.

For example, when the second partition 522 or the third partition 523 is omitted, the external impact or external pressure caused by a falling of the pen input device 220 or an external force applied to the pen input device 220 may cause deformation such as crushing or denting the conductive member 450. The conductive member 450 is a passage of a current flow, and may have resistance. If the conductive member 450 is deformed due to the external impact or external pressure, the resistance of the deformed portion may be increased. Subsequently, an increase in the resistance of the deformed portion may cause a voltage drop in the voltage substantially reaching the PCB 430 from the battery 440, and thus the voltage may be lowered than a reference voltage at which the pen input device 220 operates. Therefore, it may be difficult to turn on the power of the pen input device 220. In another example, the conductive member 450 of the battery 440 may be cut off by the external impact or external pressure. The second partition 522 and/or the third partition 523 may reduce stress in the conductive member 450 when the external impact or external pressure occurs, thus preventing the conductive member 450 from being deformed or damaged.

For example, when the second partition 522 or the third partition 523 is omitted, the external impact or external pressure caused by a falling of the pen input device 220 or an external force applied to the pen input device 220 may be transmitted to the battery 440 and thereby cause an explosion of the battery 440. That is, the external impact or external pressure may cause cracks of the positive electrode plate, or a short circuit between the positive and negative electrode plates due to tearing or cracking of the separator, thereby resulting in an explosion of the battery 440. The second partition 522 or the third partition 523 may prevent damage of the battery 440 by reducing stress in the battery 440 when the external impact or external pressure occurs. If the battery 440 explodes, the cover 442 may be broken or separated, and a flame accompanied by heat may be released toward the second partition 522. The second partition 522 may protect the user by blocking the flame.

The conductive member 450 may be formed of a flexible material to reduce deformation due to the external impact or external pressure.

The input device assembly 400 may include an input device. The input device assembly 400 includes a push switch 436 disposed on the first surface 431 of the PCB 430. In addition, the input device assembly 400 may include a pressing member 460 combined with the second partition 522 in the form of a cantilever. When the pressing member 460 sags by an external force, the push switch 436 may be pressed by a part of the pressing member 460 to generate a signal. The signal generated by the push switch 436 may be transmitted to the electronic device 200 of FIG. 2A by first wireless communication through the pen input generator 420 or second wireless communication through at least one antenna.

Various other input devices (or input modules) may be implemented in the input device assembly 400. For example, the input device may include various user input detection elements, such as a pressure sensor, a touch sensor, or an ultrasonic sensor, capable of detecting a user input, Depending on the addition of such user input detection elements, the push switch 436 and/or the pressing member 460 may be omitted or replaced in another form.

Figure 6:
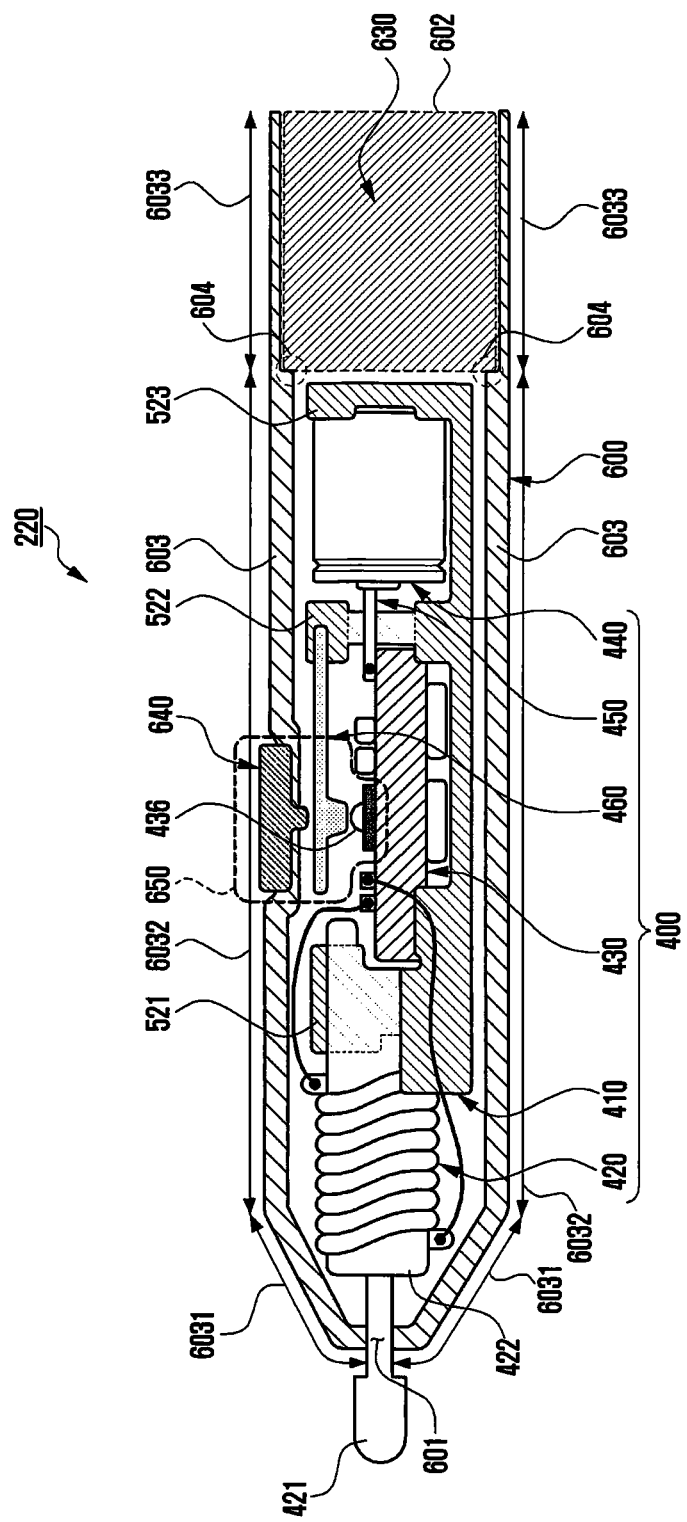
FIG. 6 illustrates a cross-sectional view of a pen input device of FIG. 3 according to an embodiment.

FIG. 6 illustrates a cross-sectional view of the pen input device 220 of FIG. 3 according to an embodiment.

Referring to FIG. 6, the pen input device 220 includes a housing 600, the input device assembly 400, and a buffer 630 (e.g., a buffer member, a buffer component, or a buffer part). The input device assembly 400 includes, as described with reference to FIG. 4, the support 410 (e.g., a holder), the pen input generator 420 (e.g., a pen tip sensor), the PCB 430, the battery 440, the conductive member 450, and the pressing member 460, and a duplicate description thereof will be omitted below.

The housing 600 (e.g., a housing structure, or a housing assembly) may provide an inner space for accommodating electronic components of the pen input device 220 and also, at least in part, form the appearance of the pen input device 220. The housing 600 may include a tubular housing. The housing 600 includes a front opening 601 and a rear opening 602 disposed opposite to each other, and a tube wall 603 extended from the front opening 601 to the rear opening 602. The housing 600 may be implemented as a unibody-type housing (e.g., a tubular housing). The housing 600 may be formed of ceramic, polymer, metal (e.g., aluminum), or any combination thereof, and may be substantially rigid.

The input device assembly 400 may be disposed at least partially inside the housing 600. The pen tip 421 of the pen input generator 420 (e.g., a pen tip sensor) may penetrate the front opening 601 of the housing 600 and protrude to the outside.

The tube wall 603 of the housing 600 includes a front portion 6031, a middle portion 6032, and a rear portion 6033. The front portion 6031 has the front opening 601 and may be tapered as it goes to the front opening 601. The middle portion 6032 is disposed between the front portion 6031 and the rear portion 6033. The middle portion 6032 and the rear portion 6033 may be elongated straightly in general. The rear portion 6033 may form the rear opening 602. The outer surfaces of the front portion 6031, the middle portion 6032, and the rear portion 6033 may be seamlessly connected.

The input device assembly 400 may be disposed inside the housing such that the pen input generator 420 (or the core 422 of the pen input generator 420) is placed in close contact with the front portion 6031. At least a portion (e.g., a portion near the battery 440) between the support 410 and the inner surface of the housing 600 may be filled with a bonding material, so that the pen input generator 420 may be kept in a state of close contact with the front portion 6031. The bonding material filled in the at least a portion between the support 410 and the inner surface of the housing 600 may be what a part of a bonding material used in fixing the buffer 630 inserted into the rear portion 6033 of the housing 600 flows toward the third partition 523 and/or the battery 440.

The input device assembly 400 may be spaced apart from the tube wall 603 of the housing 600 at locations other than the position where the pen input generator 420 (or the core 422 of the pen input generator 420) is in close contact with the front portion 6031. At least a part of the support 410 may be spaced apart from the tube wall 603 of the housing 600 to form a space therebetween.

At least one support member may be disposed at least in part between the input device assembly 400 and the inner surface of the housing 600. The at least one support member may allow the input device assembly 400 to be placed in the housing 600 without shaking. The at least one support member may reduce the effect of external impact or external pressure, caused by a falling of the pen input device 220 or an external force applied to the pen input device 220, on the input device assembly 400 (e.g., stress relief). For example, when the external impact or external pressure is applied to the pen input device 220, the support member may reduce stress in the battery 440 and/or stress in the conductive member 450 connecting the PCB 430 and the battery 440. The support member may include an O-ring. The support member may serve as a seal member to realize waterproofing of at least a part of the pen input device 220. The O-ring may be disposed between the support 410 and the inner surface of the housing 600 at the location of the first partition 521. The O-ring may be interposed at a position where the pen input generator 420 (or the core 422 of the pen input generator 420) is in close contact with the front portion 6031 of the tube wall 603, The support 410 may be separated from the inner surface of the housing 600 by at least one O-ring.

The rigidly implemented housing 600 may protect the input device assembly 400 against an external impact or external pressure caused by a falling of the pen input device 220 or an external force applied to the pen input device 220. For example, the housing 600 may reduce or block the external impact or external pressure from being delivered to the battery 440 or the conductive member 450 connecting the PCB 430 and the battery 440.

The buffer 630 may be disposed in the rear opening 602 formed at the rear portion 6033. The buffer 630 may be formed of various materials capable of filling the rear opening 602. The buffer 630 may be disposed to be spaced apart from the third partition 523 of the input device assembly 400, The buffer 630 may not protrude outside the tube wall 603. The buffer 630 may reduce or block the external impact or external pressure caused by the falling of the pen input device 220 or the external force applied to the pen input device 220 from being delivered to the input device assembly 400, The buffer 630 may be formed of various materials capable of absorbing or alleviating an impact. For example, when the pen input device 220 falls with the pen tip 421 being upward and thus the rear portion 6033 of the tube wall 603 hits the floor, the buffer 630 may prevent an external impact caused by such falling from being delivered to the battery 440 or the conductive member 450 electrically connecting the PCB 430 and the battery 440. The buffer 630 may also be referred to as a 'stopper', for example.

The rear portion 6033 of the tube wall 603 may be formed with a thickness less than that of the middle portion 6032, and a border between the inner surface of the rear portion 6033 and the inner surface of the middle portion 6032 may form a stepped structure 604. The stepped structure 604 may prevent the buffer 630 from moving toward the third partition 523 of the support 410 in order to protect the input device assembly 400 against the external impact or external pressure. For example, when the pen input device 220 falls with the pen tip 421 being upward and thus the rear portion 6033 of the tube wall 603 hits the floor, the stress caused by the external impact due to such falling may occur substantially in the stepped structure 604. Even if such stress occurs in the stepped structure 604, the housing 600 and the buffer 630 may have corresponding rigidity or durability.

Additionally or to replace the stepped structure 604, a bonding material may be disposed between the rear portion 6033 of the tube wall 603 and the buffer 630. The bonding material may prevent the buffer 630 from moving toward the third partition 523 of the support 410 against an external impact or external pressure.

The housing 600 may have a structure in which a rear wall facing the third partition 523 is integrally formed with the tube wall 603 without the rear opening 602. Another buffer (e.g., a stopper) may be disposed between the rear wall and the third partition 523.

In order to induce the pen tip 421 upward when the pen input device 220 falls, the center of gravity may be biased away from the pen tip 421 (e.g., near the buffer 630). This may reduce the possibility of damage to the pen tip 421 during such falling.

The buffer 630 may be implemented in a clip form to be utilized when the pen input device 220 is attached to a place such as clothes. The buffer 630 may be implemented as a magnet to be used when the pen input device 220 is attached. The buffer 630 may include an antenna radiator to be utilized for wireless communication.

The pen input device 220 may include an input device 650. The input device 650 includes a button 640, the pressing member 460, and the push switch 436. The button 640 may be disposed in the middle portion 6032 of the tube wall 603. When the button 640 is pressed by an external force, a part of the button 640 causes the pressing member 460 of the input device assembly 400 to sag, whereby the push switch 436 is pressed and generates a signal.

The input device may include various user input detection elements user input detector), such as a pressure sensor, a touch sensor, or an ultrasonic sensor, capable of detecting a user input. Depending on the addition of such user input detection elements, at least a part of the input device 650 shown in FIG. 6 may be implemented differently.

For example, the button 640 may be configured in various forms to detect a user input. The button 640 may be disposed inside the housing 600 or have a shape exposed outside through the opening of the housing 600. The button 640 may include, as the user input detection element, at least one of a push/pull button, a pressure sensor, a magnetic material, a wireless charging coil, an optical sensor, or a strain gauge sensor. Depending on the user input detection element included in the button 640, at least a part of the input device 650 of FIG. 6 may be replaced with other forms.

When the user input detection element such as the touch sensor, the pressure sensor, or the ultrasonic sensor is disposed inside the housing 600, a structure including the button 640 and the opening of the housing 600 where the button 650 is disposed may be omitted. For example, a user input may be detected by the user input detection element through a part of the surface of the housing 600.

Figure 7:
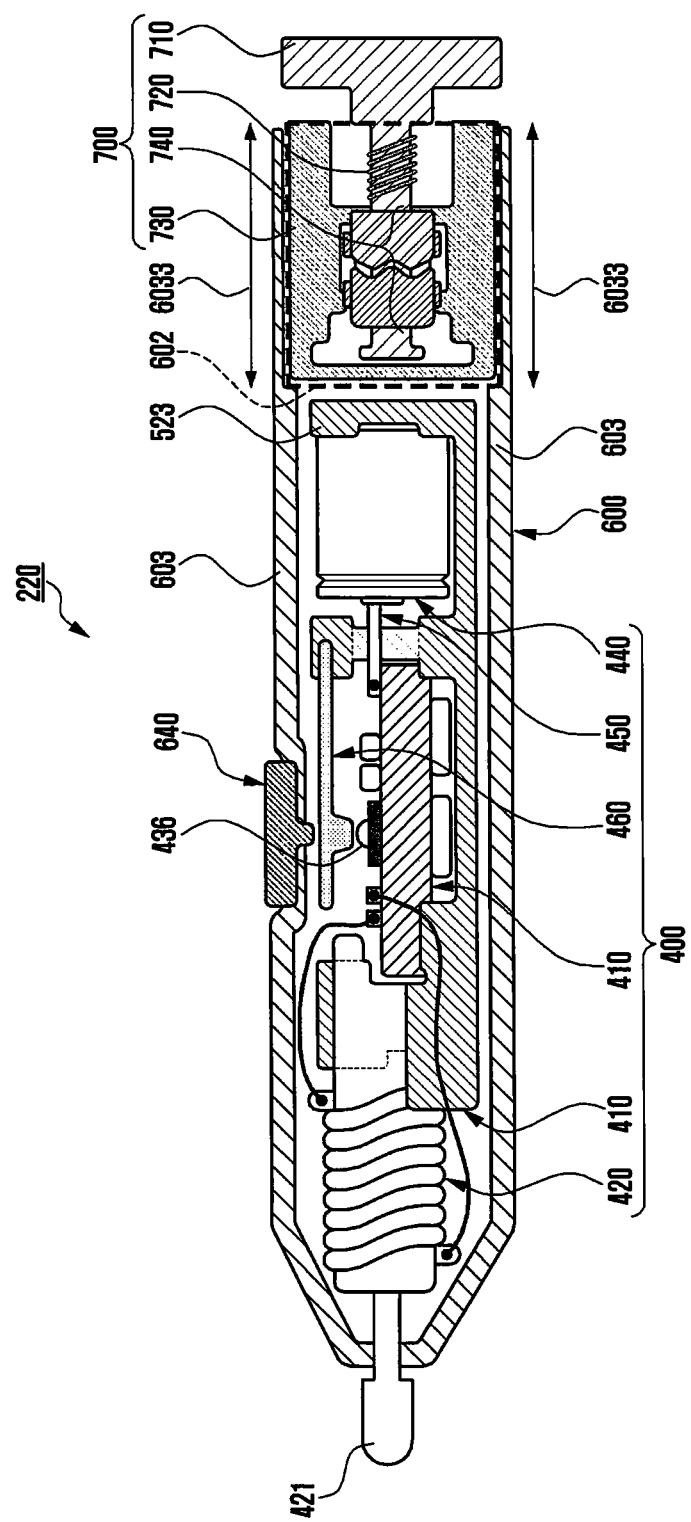
FIG. 7 illustrates a cross-sectional view of a pen input device of FIG. 3 according to an embodiment.

FIG. 7 illustrates a cross-sectional view of the pen input device 220 of FIG. 3 according to an embodiment.

Referring to FIG. 7, the pen input device 220 includes the housing 600, the input device assembly 400, the button 640, and a click structure 700. The input device assembly 400 includes, as described with reference to FIG. 4, the support 410 (e.g., a holder), the pen input generator 420 (e.g., a pen tip sensor), the PCB 430, the battery 440, the conductive member 450, and the pressing member 460, and a duplicate description thereof will be omitted below. The housing 600 and the button 640 have been described above with reference to FIG. 6, and a description thereof will be omitted.

The click structure 700 facilitates the attachment or detachment of the pen input device 220 into or from the housing 210 of FIG. 2A, and may be disposed in the rear opening 602 formed in the rear portion 6033 of the tube wall 603. The click structure 700 includes a buffer 730 (e.g., a stopper), a button 710 that may be pushed in the buffer 730, and an elastic member 720 (e.g., a compression spring) elastically supporting the button 710 with respect to the buffer 730. The click structure 700 further includes a thrust device 740 that is connected to the button 710 and the elastic member 720 and generates, when the button 710 is pressed toward the pen tip 421 and then released, a reaction force in the opposite direction.

Similar to the buffer 630 of FIG. 6, the buffer 730 may reduce or block an external impact or external pressure caused by a falling of the pen input device 220 or an external force applied to the pen input device 220 from being delivered to the input device assembly 400. The rear portion 6033 of the tube wall 603 may be formed with a thickness less than that of the middle portion 6032, and a border between the inner surface of the rear portion 6033 and the inner surface of the middle portion 6032 may form a stepped structure (e.g., the stepped structure 604 in FIG. 6). The stepped structure may prevent the buffer 730 from moving toward the third partition 523 of the support 410 in order to protect the input device assembly 400 against the external impact or external pressure.

Figure 8:
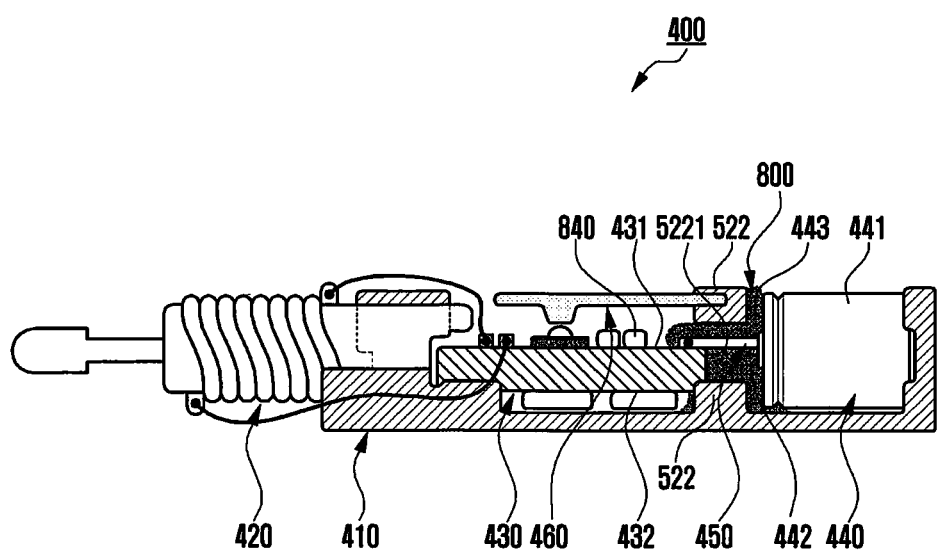
FIG. 8 illustrates a cross-sectional view of an input device assembly included in a pen input device of FIG. 3 according to an embodiment.

FIG. 8 illustrates a cross-sectional view of an input device assembly included in the pen input device of FIG. 3 according to an embodiment.

Referring to FIG. 8, the input device assembly 400 includes, as described with reference to FIG. 4, the support 410 (e.g., a holder), the pen input generator 420 (e.g., a pen tip sensor), the PCB 430, the battery 440, the conductive member 450, and the pressing member 460, and a duplicate description thereof will be omitted below.

The input device assembly 400 further includes a polymer 800 disposed at least partially among the support 410, the PCB 430, the battery 440, and the conductive member 450. For example, the polymer 800 may be filled at least between the second partition 522 and the battery 440 and in the second opening 5221 of the second partition 522. The polymer 800 may be filled at least between the first surface 431 of the PCB 430, the second surface 432 of the PCB 430, and the third surface 443 of the battery 440 facing the second partition 522. The polymer 800 may be filled at least between the pouch 441 of the battery 440 and the support 410. The polymer 800 may be expanded without being limited to an example shown in FIG. 8.

The polymer 800 may include a buffer material that alleviates the effect of the explosion of the battery 440. When the battery 440 explodes, the cover 442 may be broken or separated, and a flame accompanied by heat may be released toward the second partition 522, The polymer 800 may protect the user by buffering or blocking the flame. The polymer 800 may be a soft polymer as a buffer material. The polymer 800, as a buffer material, may be a material having low elasticity and adhesion.

Waterproofing of at least a part of the input device assembly 400 may be implemented by the polymer 800.

The polymer 800 may increase a bonding force among the support 410, the PCB 430, the battery 440, and the conductive member 450. The polymer 800 may reduce the shaking, fluctuation, or vibration of the conductive member 450 and/or the battery 440 against the external impact or external pressure, thereby preventing the conductive member 450 from being deformed or damaged or the battery 440 from being damaged. The polymer 800 may reduce the effect of external impact or external pressure, caused by a falling of the pen input device 220 or an external force applied to the pen input device 220, on the input device assembly 400 (e.g., stress relief). For example, when the external impact or external pressure is applied to the pen input device 220, the polymer 800 may reduce stress in the battery 440 and/or stress in the conductive member 450 connecting the PCB 430 and the battery 440.

The polymer 800 may include a hard polymer (e.g., epoxy). A soft polymer may also be used as a material that increases a bonding force among the support 410, the PCB 430, the battery 440, and the conductive member 450.

The polymer 800 may include a photo-curable material (e.g., epoxy) that is cured by light (e.g., ultraviolet light) of a specific frequency band.

A temperature sensor 840 is disposed on the first surface 431 of the PCB 430. The temperature sensor 840 may be disposed on the second surface 432 of the PCB 430. The heat of the battery 440 may be transferred to the temperature sensor 840 through the second opening 5221 of the second partition 522. The temperature of the battery 440 may be measured by the temperature sensor 840 and considered when it is determined whether the battery 440 is abnormal. For example, when the temperature of the battery 440 is greater than a threshold, a controller (e.g., a power management controller) disposed on the PCB 430 may determine that the battery 440 is abnormal. The abnormality of the battery 440 may be various such as a defect or damage of the battery 440 and a defect of a power system associated with the battery 440. The abnormality of the battery 440 may cause an explosion. The polymer 800 may include a heat transfer material and may be extended to cover at least in part the temperature sensor 840. The heat of the battery 440 may be conducted to the polymer 800, and the temperature sensor 840 may detect the heat of the battery 440 through the polymer 800. The polymer 800 may be a synthetic polymer containing a heat transfer material. The polymer 800 may include a thermal interface material (TIM). The polymer 800 of a heat transfer material such as a TIM may have low elasticity and adhesion, and may alleviate the effect of the explosion of the battery 440. The polymer 800 may include various materials having high thermal conductivity.

Figure 9:
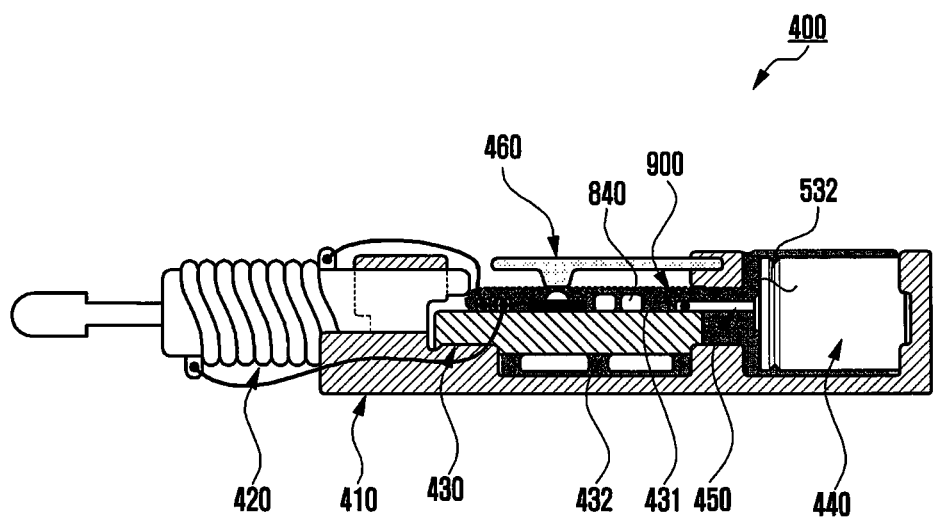
FIG. 9 illustrates a cross-sectional view of an input device assembly included in a pen input device of FIG. 3 according to an embodiment.

FIG. 9 illustrates a cross-sectional view of an input device assembly 400 included in the pen input device 220 of FIG. 3 according to an embodiment.

Referring to FIG. 9, the input device assembly 400 includes, as described with reference to FIG. 4, the support 410 (e.g., a holder), the pen input generator 420 (e.g., a pen tip sensor), the PCB 430, the battery 440, the conductive member 450, and the pressing member 460, and a duplicate description thereof will be omitted below.

The input device assembly 400 further includes a polymer 900 disposed at least partially among the support 410, the PCB 430, the battery 440, and the conductive member 450. Compared to the embodiment of FIG. 8, the polymer 900 may further cover the first surface 431 of the PCB 430 and components disposed on the first surface 431 and/or the second surface 432 of the PCB 430 and components disposed on the second surface 432, and may be further filled in the second container 532 of the support 410.

Waterproofing of at least a part of the input device assembly 400 may be implemented by the polymer 900.

The polymer 900 may increase a bonding force among the support 410, the PCB 430, the battery 440, and the conductive member 450. The polymer 900 may reduce the external impact or external pressure delivered to the conductive member 450 and/or the battery 440, thereby preventing the conductive member 450 from being deformed or damaged or the battery 440 from being damaged. The polymer 900 may a hard polymer (e.g., epoxy) or a soft polymer.

The polymer 900 may include a buffer material that alleviates the effect of the explosion of the battery 440. The polymer 900 may be a soft polymer, as a buffer material, having low elasticity and adhesion.

The polymer 900 may cover at least the first surface 431 and/or the second surface 432 of the PCB 900. The polymer 900 may cover at least partially the temperature sensor 840 (e.g., a temperature sensor) disposed on the first surface 431 of the PCB 430. The heat of the battery 440 may be conducted to the polymer 900, and the temperature sensor 840 may detect the heat of the battery 440 through the polymer 900, The polymer 900 may be a hard polymer having a high thermal conductivity or a soft polymer.

Figure 10:
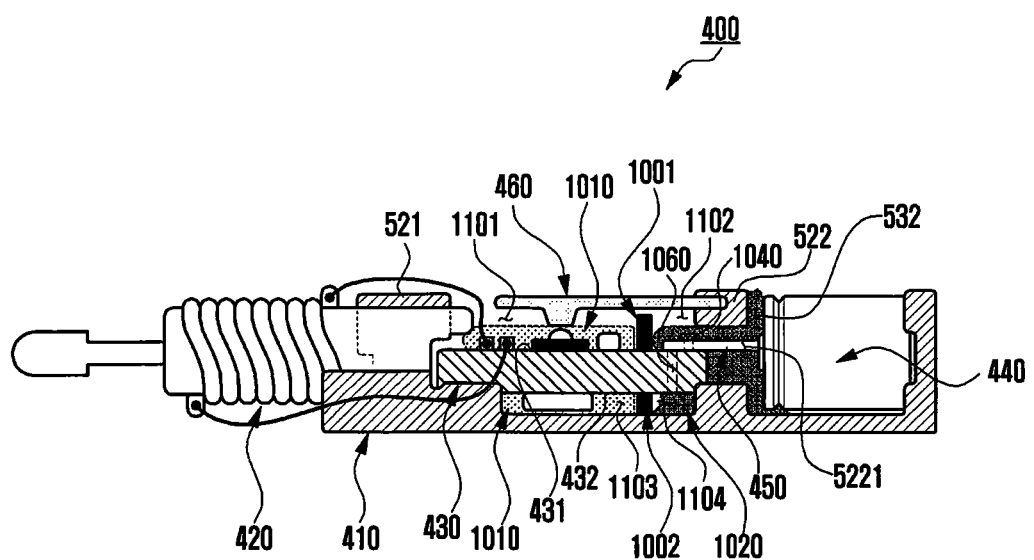
FIG. 10 illustrates a cross-sectional view of an input device assembly included in a pen input device of FIG. 3 according to an embodiment.
Figure 11:
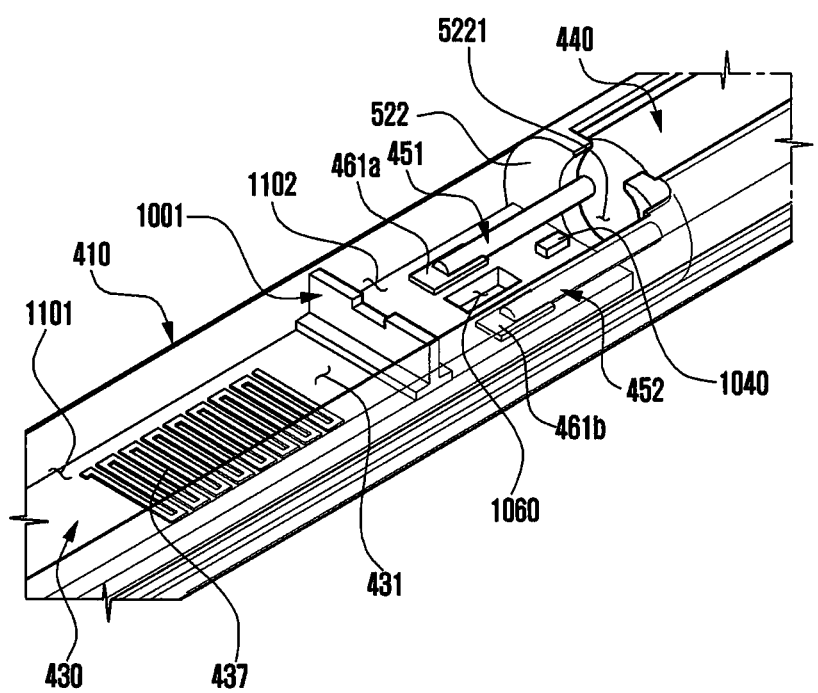
FIG. 11 illustrates a perspective view of the input device assembly of FIG. 10 according to an embodiment.

FIG. 10 illustrates a cross-sectional view of an input device assembly 400 included in the pen input device 220 of FIG. 3 according to an embodiment. FIG. 11 illustrates a perspective view of the input device assembly 400 of FIG. 10 according to an embodiment.

Referring to FIGS. 10 and 11, the input device assembly 400 includes, as described with reference to FIG. 4, the support 410 (e.g., a holder), the pen input generator 420 (e.g., a pen tip sensor), the PCB 430, the battery 440, the conductive member 450, and the pressing member 460, and a duplicate description thereof will be omitted below.

The input device assembly 400 includes a fourth partition 1001 and a fifth partition 1002 each of which divides a space of the first container (e.g., the first container 531 in FIG. 5) of the support 410. The fourth partition 1001 may be disposed on or combined with the first surface 431 of the PCB 430, and the first container (e.g., the first container 531 in FIG. 5) of the support 410 may have a first space 1101 and a second space 1102 formed by the fourth partition 1001 on the first surface 431 of the PCB 430. The first space 1101 may be disposed between the first partition 521 and the fourth partition 1001, and the second space 1102 may be disposed between the fourth partition 1001 and the second partition 522. The fifth partition 1002 may be disposed on or combined with the second surface 432 of the PCB 430, and the first container 531 of the support 410 may have a third space 1103 and a fourth space 1104 formed by the fifth partition 1002 on the second surface 432 of the PCB 430. The third space 1103 may be disposed between the first partition 521 and the fifth partition 1002, and the fourth space 1104 may be disposed between the fifth partition 1002 and the second partition 522.

The fourth partition 1001 and the fifth partition 1002 may be disposed at the substantially same distance from the second partition 522. The fourth partition 1001 and the fifth partition 1002 may be disposed at different distances from the second partition 522.

The fifth partition 1002 may be integrally formed with the support 410 and may include the same material as the support 410.

A first contact portion 461a, a second contact portion 461b, and a temperature sensor 1040 (e.g., the temperature sensor 840 in FIG. 9) are disposed on the first surface 431 of the PCB 430 in the second space 1102. Each of the first and second contact portions 461a and 461b may be a copper foil pad or land formed on the first surface 431. The conductive member 450 may include the first conductive member 451 (e.g., a positive electrode tab) electrically connected to the positive electrode plate of the battery 440, and the second conductive member 452 (e.g., a negative electrode tab) electrically connected to the negative electrode plate of the battery 440. The first conductive member 451 and the second conductive member 452 may be extended straightly in parallel with each other. Through a conductive bonding material, such as solder, one end of the first conductive member 451 may be electrically connected to the first contact portion 461a, and one end of the second conductive member 452 may be electrically connected to the second contact portion 461b.

The temperature sensor 1040 may be disposed on the first surface 431 of the PCB 430 between the fourth partition 1001 and the second partition 522. The temperature sensor 1040 may be disposed close to the battery 440 near the second opening 5221 of the second partition 522, thereby ensuring the performance of detecting the temperature of the battery 440.

The temperature sensor 1040 may be disposed on the second surface 432 of the PCB 430 between the fifth partition 1002 and the second partition 522.

When viewed from above the first surface 431 of the PCB 430, the temperature sensor 1040 may be disposed closer to the second partition 522 than to the first contact portion 461a or the second contact portion 461b. When viewed from above the first surface 431 of the PCB 430, the temperature sensor 1040 may be disposed between the first conductive member 451 and the second conductive member 452.

An antenna 437 (or an antenna radiator) may be disposed on the first surface 431 of the PCB 430 in the first space 1101.

The input device assembly 400 includes a first polymer 1010 filled in the first space 1101 and the third space 1103, Waterproofing of a part of the input device assembly 400 may be implemented by the first polymer 1010. In the first space 1101, the first polymer 1010 may cover at least the first surface 431 of the PCB 430 and/or components (e.g., the antenna 437) disposed on the first surface 431. In the third space 1103, the first polymer 1010 may cover at least the second surface 432 of the PCB 430 and/or components disposed on the second surface 432.

The input device assembly 400 includes a second polymer 1020 filled in a space composed of the second space 1102, the fourth space 1104, the second opening 5221 of the second partition 522, and the second container 532. Waterproofing of a part of the input device assembly 400 may be implemented by the second polymer 1020. In the second space 1102, the second polymer 1020 may cover at least the first surface 431 of the PCB 430 and/or components (e.g., the first contact portion 461a, the second contact portion 461b, and the temperature sensor 1040) disposed on the first surface 431. In the fourth space 1104, the second polymer 1020 may cover at least the second surface 432 of the PCB 430 and/or components disposed on the second surface 432. The second polymer 1020 may enclose the conductive member 450 (e.g., the first conductive member 451 and the second conductive member 452). The second polymer 1020 may be filled at least between the battery 440 and the second partition 522.

The PCB 430 includes an opening 1060 penetrating from the first surface 43:1 to the second surface 432. When being filled, the second polymer 1020 may flow from the second space 1102 to the fourth space 1104 through the opening 1060.

The first polymer 1010 may include a material different from that of the second polymer 1020. For example, the first polymer 1010 may be a hard polymer (e.g., epoxy), and the second polymer 1020 may be a soft polymer (e.g., TIM). When a user input detector, such as a touch sensor, a pressure sensor, or an ultrasonic sensor, is disposed inside the housing 600, a structure including the button 640 and an opening of the housing 600 where the button 650 is disposed may be omitted. In this case, the housing 600 may be formed without the opening for accommodating the button 650, and also the first polymer 1010 for waterproofing may be omitted.

The second polymer 1020 may include a buffer material that alleviates the effect of the explosion of the battery 440. The second polymer 1020 may be a soft polymer, as a buffer material, having low elasticity and adhesion.

The second polymer 1020 may include a heat transfer material. The heat of the battery 440 may be conducted to the second polymer 1020, and the temperature sensor 1040 may detect the heat of the battery 440 through the second polymer 1040. The second polymer 1040 may include the TIM. The second polymer 1040 of a heat transfer material, such as a TIM, may have low elasticity and adhesion, and may alleviate the effect of the explosion of the battery 440. The second polymer 1040 may include various materials having high thermal conductivity.

The second polymer 1020 may include a hard heat transfer material. The second polymer 1020 may not only transfer the temperature of the battery 440 to the temperature sensor 1040, but also increase a bonding force among the support 410, the PCB 430, the battery 440, and the conductive member 450. The second polymer 1020 may reduce an external impact or external pressure delivered to the conductive member 450 and/or the battery 440, thereby preventing the conductive member 450 from being deformed or damaged or the battery 440 from being damaged.

Figure 12:
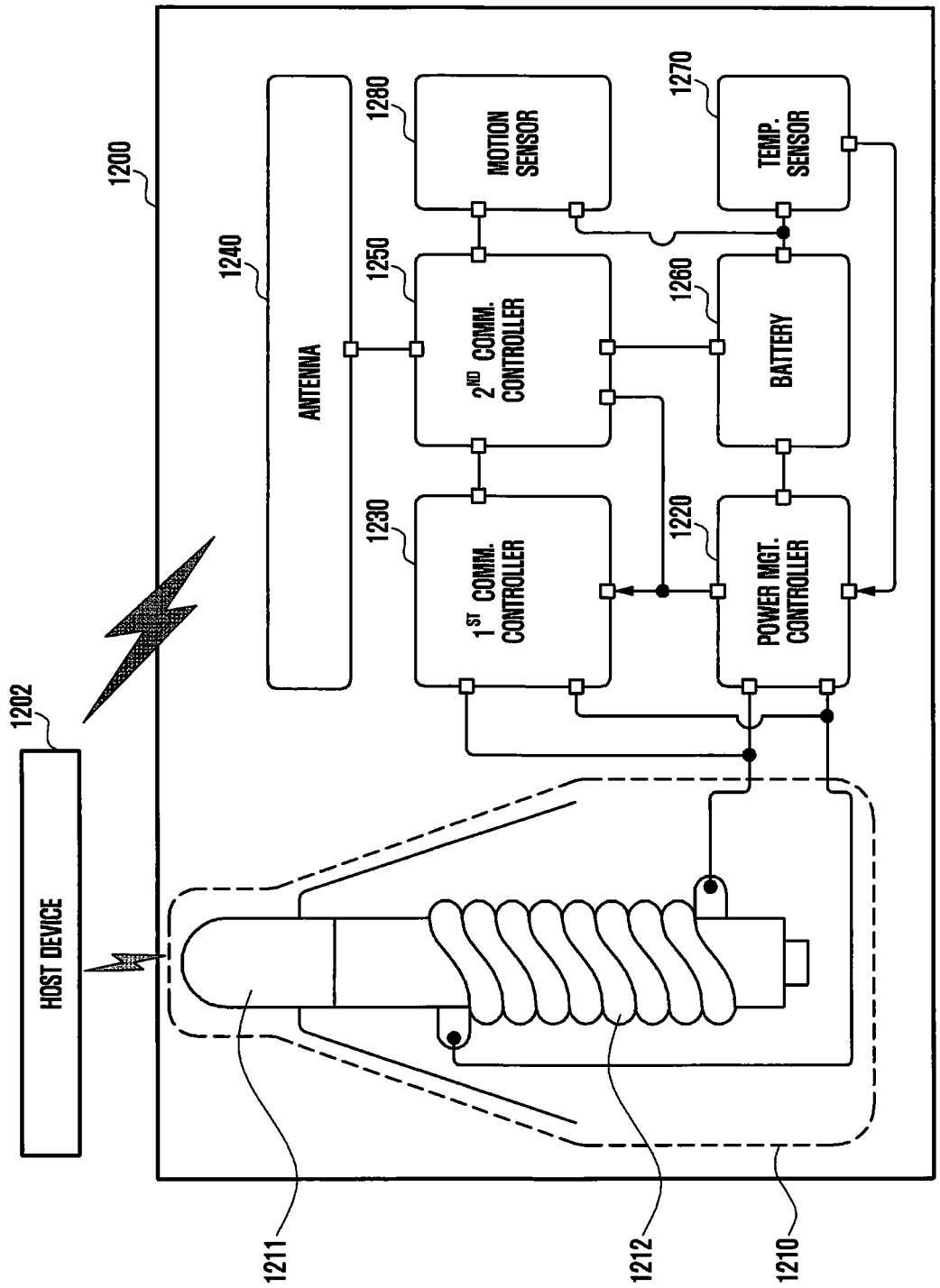
FIG. 12 is a block diagram illustrating a pen input device according to an embodiment.

FIG. 12 illustrates a pen input device according to an embodiment.

Referring to FIG. 12, a pen input device 1200 includes a pen tip sensor 1210 (e.g., a pen input generating structure, a pen input generating assembly, or a pen input generating unit), a power management controller 1220 (e.g., a power management unit, a power management module, a power management IC, a power management microcontroller, or a power management processor), a first communication controller 1230 (e.g., a first communication unit, a first communication module, a first communication IC, a first communication microcontroller, or a first communication processor), an antenna 1240, a second communication controller 1250 (e.g., a second communication unit, a second communication module, a second communication IC, a second communication microcontroller, or a second communication processor), a battery 1260, a temperature sensor 1270 (e.g., a temperature sensing unit), and/or a motion sensor 1280 (e.g., a motion sensing unit). The pen input device 1200 may be the above-described pen input devices 220 of FIG. 3, FIG. 6, or FIG. 7. The pen input device 1200 may include the input device assembly 400 of FIG. 4, FIG. 8, FIG. 9, or FIG. 10. At least one of the power management controller 1220, the first communication controller 1230, the at least one antenna 1240, the second communication controller 1250, the temperature sensor 1270, and the motion sensor 1280 may be disposed on the PCB 430 illustrated in FIG. 6.

The pen tip sensor 1210 (e.g., the pen input generator 420 in FIG. 4) may include a pen tip 1211. The pen tip sensor 1210 may serve as a pointer indicating a location (or coordinate) of the pen input device 1200 and also serve as a pen pressure detector detecting a pen pressure. When a user input is performed on a screen (e.g., a device composed of the front plate 202, the display 201, and the electromagnetic induction panel 390 in FIG. 3) of a host device 1202 with the pen input device 1200, the pen top sensor 1210 may indicate a point where a position signal and a pen pressure signal for the screen are generated. The host device 1202 may receive the position signal and the pen pressure signal generated by the pen tip sensor 1210 through the screen, thereby recognizing the position (coordinate) and pen pressure of the user input on the screen.

The pen tip sensor 1210 may generate, when a user input is performed on the screen of the host device 1202 with the pen input device 1200, signals related to the user input by receiving energy from the screen. For example, the pen tip sensor 1210 may operate in an electromagnetic induction manner (e.g., EMR manner), and may include a coil or EMR coil 1212. The host device 1202 may supply alternating current to a magnetic field generating device such as a digitizer, and the magnetic field generating device may form a magnetic field on the screen. When the pen tip sensor 1210 is close to the screen, current may flow through the coil 1212 of the pen tip sensor 1210 by electromagnetic induction. The signals related to the user input on the screen may be generated by the pen tip sensor 1210 using energy supplied from the magnetic field generating device.

The pen tip sensor 1210 may be implemented in various manners to generate the signals related to the user input on the screen. For example, the pen tip sensor 1210 may generate the signals related to the user input on the screen by using the power of the battery 1260, For example, the pen tip sensor 1210 may generate an electrostatic signal (e.g., a signal distinct from a user's hand or finger) regarding the user input (e.g., in an AES manner). The pen tip sensor 1210 may be implemented in any other manner to generate the signals related to the user input on the screen.

When the pen input device 1200 is inserted into the host device 1202, the power management controller 1220 may wirelessly receive power (or a charging signal) from the host device 1202 and charge the battery 1260. When the pen input device 1200 is inserted into the host device 1202, the power management controller 1220 may wirelessly receive a charging signal from the host device 1202 through the pen tip sensor 1210 and charge the battery 1260. For example, the battery 1260 may be wirelessly charged in a magnetic induction manner using the coil 1212. When the pen input device 1200 is inserted into the host device 1202, a magnetic field flowing through an antenna (e.g., a coil) of the host device 1202 is applied to the coil 1212, and thereby an induced current flows in the coil 1212. Using this induced current, the power management controller 1220 may charge the battery 1260.

The first communication controller 1230 may be configured to perform first wireless communication with the host device 1202 through the pen tip sensor 1210. For example, when a user input is performed on the screen of the host device 1202 with the pen input device 1200, the pen top sensor 1210 may receive a magnetic field from the screen of the host device 1202 and thereby generate a current. Using this current, the first communication controller 1230 (e.g., an EMR communication controller) may generate a radio frequency signal related to a position signal and a pen pressure signal through the pen tip sensor 1210 and transmit the generated signal to the screen of the host device 1202.

When the user input is performed on the screen of the host device 1202 with the pen input device 1200, the pen tip sensor 1210 may receive a signal outputted through a touch sensing circuit (e.g., a touch screen panel (TSP)) of a display and thereby generate a current. Using this current, the first communication controller 1230 may generate a transmission signal (Tx signal) through the pen tip sensor 1210 and transmit the generated signal to the host device 1202.

The pen tip sensor 1210 may generate a current by receiving a signal outputted through the screen of the host device 1202 and perform the first wireless communication for transmitting a transmission signal to the host device 1202 by using the generated current. For example, the pen tip sensor 1210 may generate a current by using a signal outputted through the touch sensing circuit of the electromagnetic induction panel 390 of FIG. 3 or the display 201 of FIG. 3, and then transmit a transmission signal to the host device 1202 by using the generated current.

The pen tip sensor 1210 may generate a current by receiving a signal from at least one circuit (e.g., a resonant circuit including a coil) of the host device 1202, when the pen input device 1200 is inserted into the host device 1202, and perform the first wireless communication for transmitting a transmission signal to the host device 1202 by using the generated current.

The second communication controller 1250 may be configured to perform second wireless communication with the host device 1202 through the at least one antenna 1240 disposed in the pen input device 1200. The at least one antenna 1240 may be disposed at various positions in the pen input device 1200, e.g., on a PCB. The antenna 1240 may be disposed in a housing of the pen input device 1200. The second wireless communication may include short-range communication such as Bluetooth low energy (BLE) communication or NFC.

A signal from the temperature sensor 1270 and/or the motion sensor 1280 equipped in the pen input device 1200 may be transmitted to the host device 1202 through the first wireless communication or the second wireless communication. For example, signals from various sensors equipped in the host device 1202 may be transmitted to the pen input device 1200 through the first wireless communication or the second wireless communication.

The battery 1260 supplies power to the second communication controller 1250, the motion sensor 1280, and the temperature sensor 1270, and may include a rechargeable secondary battery.

The temperature sensor 1270 may detect the temperature of the battery 1260 and provide it to the power management controller 1220. Based on the temperature of the battery 1260 provided from the temperature sensor 1270, the power management controller 1220 may operate the pen input device 1200 in a passive mode or an active mode.

The passive mode may deactivate at least one function (e.g., the second wireless communication and related functions, or a charging function) related to the battery 1260. Such deactivation may include blocking the power of the battery 1260 from being used for the corresponding function.

For example, in the passive mode, the power management controller 1220 may preferentially deactivate the charging function. When a wireless charging signal is detected through the pen tip sensor 1210 in the passive mode, the power management controller 1220 may block power from being transmitted to the battery 1260. When no wireless charging signal is detected through the pen tip sensor 1210 in the passive mode, the power management controller 1220 may further block the power of the battery 1260 from being transmitted to the second communication controller 1250 and the motion sensor 1280.

The passive mode may be selected when the temperature of the battery 1260 is greater than a threshold. For example, when there is a defect or abnormality in the battery 1260 or a related power system, the temperature of the battery 1260 may be greater than the threshold. The passive mode may reduce the possibility of explosion of the battery 1260 by restricting the use of the battery 1260 or the load on the battery 1260.

In the passive mode, the first wireless communication and related functions may be performed. For example, in the passive mode, when a user input is performed on the screen of the host device 1202 with the pen input device 1200, the position signal and the pen pressure signal of the pen input device 1200 may be transmitted to the host device 1202 through the first wireless communication.

The active mode may activate at least one function related to the battery 1260. The active mode may be selected when the temperature of the battery 1260 is less than or equal to the threshold. In the active mode, the first wireless communication and related functions may be performed.

In the active mode, the power management controller 1220 may provide the power of the battery 1260 to the first communication controller 1230 from among the first communication controller 1230 and the second communication controller 1250. In the active mode, the second communication controller 1250 may operate based on a signal (e.g., a signal voltage) from the first communication controller 1230. For example, in the active mode, the first communication controller 1230 may control the second communication controller 1250, In the active mode, although the power of the battery 1260 is applied to the first communication controller 1230, the first communication controller 1230 may perform the first wireless communication using the pen tip sensor 1210 without the power of the battery 1260.

The host device 1202 may include, for the second wireless communication with the pen input device 1200, at least one antenna and a communication controller (e.g., a BLE communication controller). The host device 1202 may include, for the first wireless communication with the pen input device 1200, a magnetic field generating device (e.g., a coil) and a communication controller (e.g., an EMR communication controller). When the pen input device 1200 is inserted into the host device 1202, the magnetic field formed by the magnetic field generating device may be applied to the pen tip sensor 1210.

Figure 13:
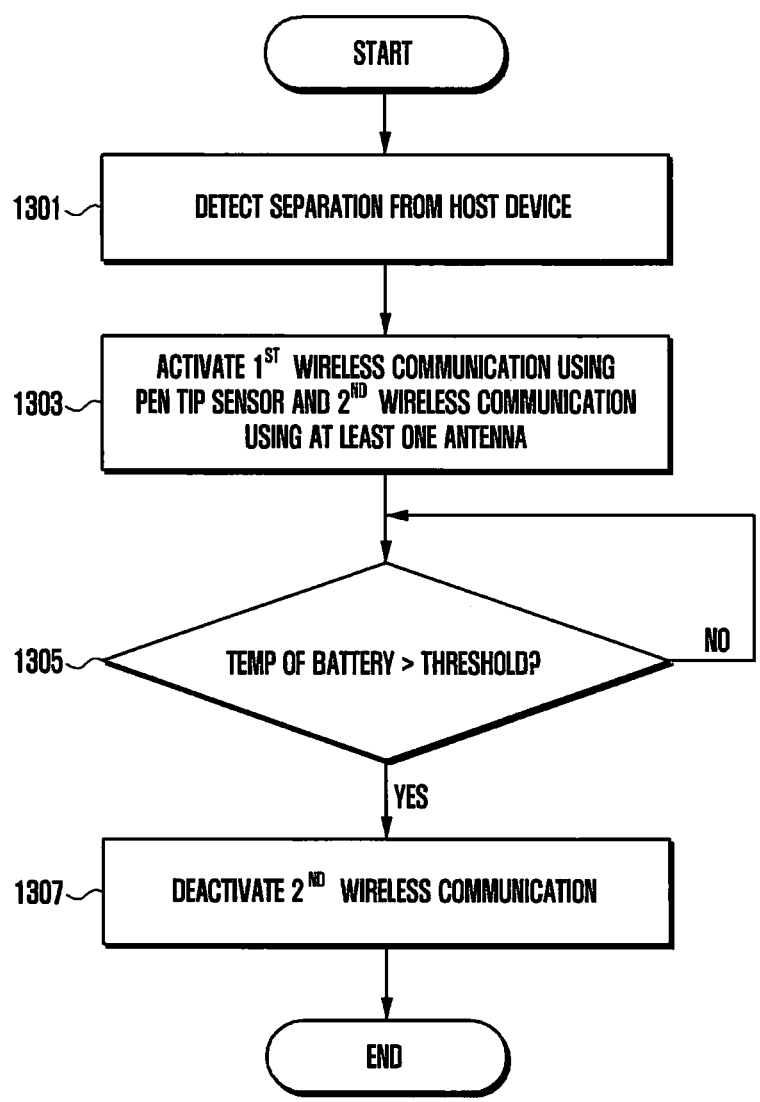
FIG. 13 is a flow chart illustrating a method of a pen input device being separated from a host device according to an embodiment.

FIG. 13 is a flow chart illustrating a method of a pen input device being separated from a host device according to an embodiment.

Referring to FIG. 13, in step 1301, the power management controller 1220 of the pen input device 1200 detects that the pen input device 1200 is separated from the host device 1202. When inserted into the host device 1202, the pen input device 1200 may receive a charging voltage or a charging signal from the magnetic field generating device (e.g., the charging coil) of the host device 1202 through the pen tip sensor 1210, If the charging voltage or the charging signal is not received, the power management controller 1220 may determine that the pen input device 1200 is separated from the host device 1202.

In step 1303, the power management controller 1220 of the pen input device 1200 activates (e.g., an active mode) the first wireless communication using the pen tip sensor 1210 and the second wireless communication using the at least one antenna 1240.

For example, the first communication controller 1230 may perform the first wireless communication using the pen tip sensor 1210. When a user input is performed on the screen of the host device 1202 with the pen input device 1200, the pen tip sensor 1210 may generate a current by receiving a magnetic field from the screen of the host device 1202. Using the generated current, the first communication controller 1230 may generate a radio frequency signal related to a position signal and a pen pressure signal through the pen tip sensor 1210 and transmit the generated signal to the screen of the host device 1202.

For example, the second communication controller 1250 may perform the second wireless communication through the antenna 1240. The second communication controller 1250 may transmit information, acquired from at least one sensor (e.g., the temperature sensor 1270 or the motion sensor 1280), to the host device 1202 through the second wireless communication.

In step 1305, the power management controller 1220 of the pen input device 1200 detects the temperature of the battery 1260 through the temperature sensor 1270 in order to determine whether the temperature of the battery 1260 exceeds a threshold.

When the temperature of the battery 1260 exceeds the threshold in step 1305, the power management controller 1220 of the pen input device 1200 deactivates (e.g., a passive mode) the second wireless communication using the antenna 1240 in step 1307. For example, in the passive mode, the power management controller 1220 may block the power of the battery 1260 from being transmitted to the second communication controller 1250 and the motion sensor 1280. When there is a defect or abnormality in the battery 1260 or a related power system, the temperature of the battery 1260 may be greater than the threshold. The passive mode may reduce the possibility of explosion of the battery 1260 by restricting the use of the battery 1260 or the load on the battery 1260.

Figure 14:
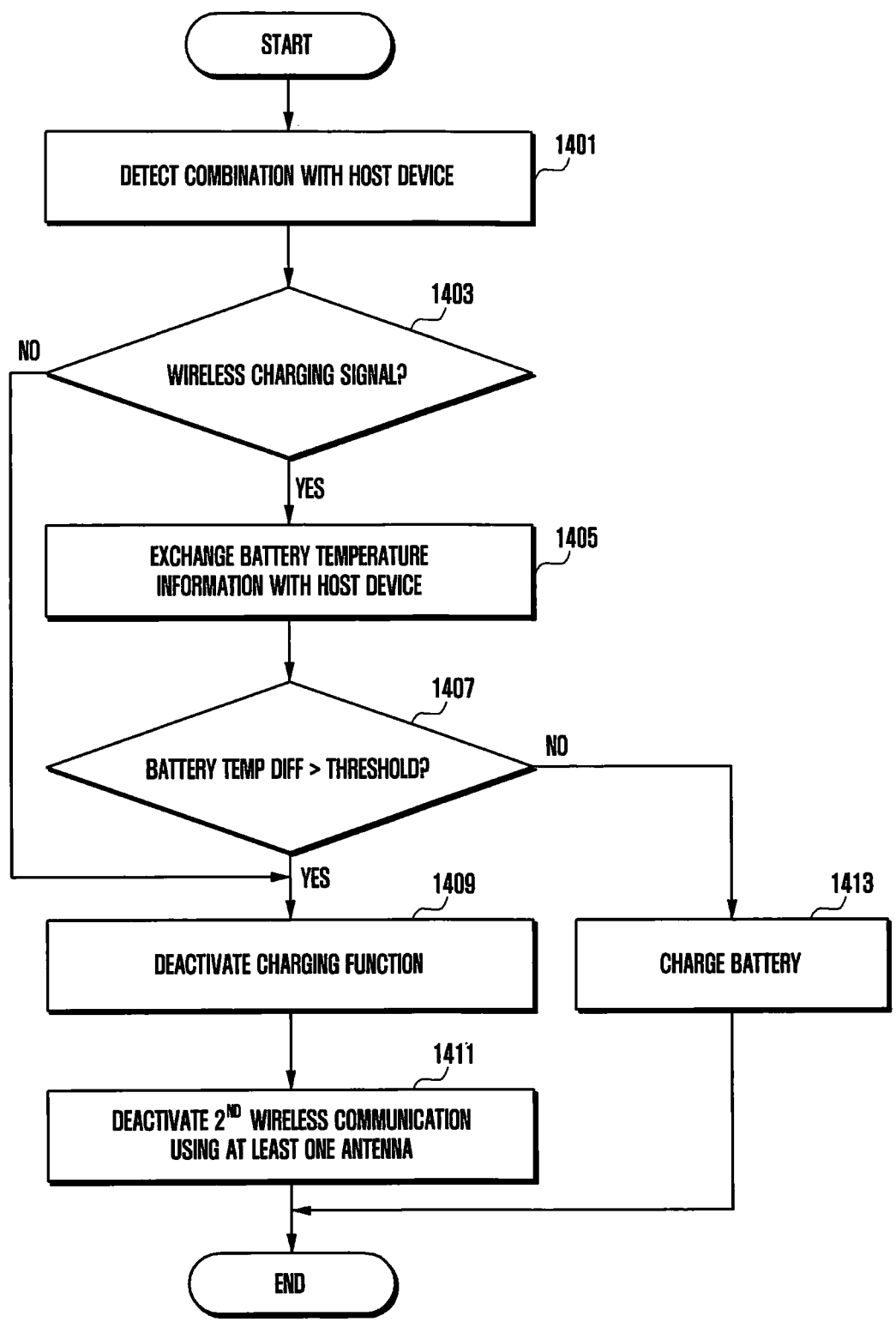
FIG. 14 is a flow chart illustrating a method of a pen input device being inserted into a host device according to an embodiment.

FIG. 14 is a flow chart illustrating a method of a pen input device being inserted into a host device according to an embodiment.

Referring to FIG. 14, in step 1401, the power management controller 1220 of the pen input device 1200 detects that the pen input device 1200 is combined with the host device 1202.

When the pen input device 1200 is inserted into the host device 1202, the combination of the pen input device 1200 with the host device 1202 may be detected through at least one sensor included in the pen input device 1200 or the host device 1202. When the pen input device 1200 is separated from the host device 1202, the separation of the pen input device 1200 from the host device 1202 may be detected through the at least one sensor included in the pen input device 1200 or the host device 1202. The host device 1202 may detect the combination or separation of the pen input device 1200, and may transmit a related signal to the pen input device 1200.

The pen input device 1200 may be attached to the housing of the host device 1202 by using a magnet. In this case, based on a magnetic force detected through the at least one sensor included in the pen input device 1200 or the host device 1202, the combination or separation between the pen input device 1200 and the host device 1202 may be detected.

In various structures where the pen input device 1200 is detachably attached to the host device 1202, the combination or separation between the pen input device 1200 and the host device 1202 may be detected through various detection manners.

In step 1403, the power management controller 1220 of the pen input device 1200 checks whether a wireless charging signal is transmitted from the host device 1202.

When inserted into the host device 1202, the pen input device 1200 may detect the wireless charging signal from the magnetic field generating device (e.g., the charging coil) of the host device 1202 through the pen tip sensor 1210. When the wireless charging signal is detected in step 1403, without step 1401, the power management controller 1220 may determine that the pen input device 1200 is inserted into the host device 1202.

If no wireless charging signal is detected from the host device 1202 in step 1403, the power management controller 1220 of the pen input device 1200 deactivates (e.g., a passive mode) the charging function in step 1409.

When the wireless charging signal is detected from the host device 1202 in step 1403, the power management controller 1220 of the pen input device 1200 exchanges (e.g., an active mode) battery temperature information with the host device 1202 through the first wireless communication using the pen tip sensor 1210 or the second wireless communication using the antenna 1240 in step 1405. The pen input device 1200 may detect the temperature of the battery 1260 through the temperature sensor 1270. Synchronously with the host device 1202, the pen tip sensor 1210 may receive the temperature information of a battery, included in the host device 1202, from the host device 1202 through the first wireless communication or the second wireless communication, and also transmit the temperature information of the battery 1260, included in the pen input device 1200, to the host device 1202.

In step 1407, the power management controller 1220 of the pen input device 1200 checks whether a difference between the temperature of the battery included in the host device 1202 and the temperature of the battery 1260 included in the pen input device 1200 exceeds a threshold.

If the above-described difference in the battery temperature exceeds the threshold, the power management controller 1220 of the pen input device 1200 deactivates (e.g., a passive mode) the charging function in step 1409. For example, when the pen input device 1200 is inserted into the host device 1202, the battery 1260 of the pen input device 1200 may have a temperature greater than or less than the threshold or more than that of the battery of the host device 1202 due to an abnormality thereof or a defect in the power system. Confirming the abnormality of the battery 1260 or the defect in the power system and then stopping the charging of the battery 1260 may prevent the explosion of the battery 1260.

In step 1411, the power management controller 1220 of the pen input device 1200 deactivates (e.g., a passive mode) the second wireless communication using the antenna 1240, For example, in the passive mode, the power management controller 1220 may block the power of the battery 1260 from being transmitted to the second communication controller 1250 and the motion sensor 1280. The passive mode may reduce the possibility of explosion of the battery 1260 by restricting the use of the battery 1260 or the load on the battery 1260.

In the passive mode, the first wireless communication using the pen tip sensor 1210 may be possible. For example, the passive mode may switch from the second wireless communication using the antenna 1240 for the first wireless communication using the pen tip sensor 1210. In the passive mode, if the charging function and the second wireless communication are deactivated, the pen input device 1200 may exchange synchronously the battery temperature information with the host device 1202 through the first wireless communication, and then, based on the temperature information, perform step 1407 and the subsequent operations.

When it is determined that the temperature of the battery included in the host device 1202 and the temperature of the battery 1260 included in the pen input device 1200 do not differ by the threshold or more in step 1407, the power management controller 1220 of the pen input device 1200 charges the battery 1260 (e.g., an active mode) using the wireless charging signal from the host device 1202 in step 1413.

An example 1 of the present disclosure may provide a pen input device (e.g., the pen input device 220 of FIG. 3). The pen input device may include a tubular housing (the housing 600 of FIG. 6) including a front opening (e.g., the front opening 601 of FIG. 6) and a rear opening (e.g., the rear opening 602 of FIG. 6) disposed opposite to each other. The pen input device may include a pen input generator (e.g. the pen input generator 420 of FIG. 6) including a pen tip (e.g., the pen tip 421 of FIG. 6) disposed in the front opening, and generating a position signal and a pen pressure signal of the pen input device. The pen input device may include a battery (e.g., the battery of FIG. 6), The pen input device may include a PCB (e.g., the PCB 430 of FIG. 6) disposed between the pen input generator and the battery, and electrically connected to the pen input generator and the battery. The pen input device may include a support (e.g., the support 410 of FIG. 6) on which at least a part of the pen input generator, the battery; and the PCB are disposed. The pen input device may include at least one conductive member (e.g., the conductive member 450 of FIG. 6) electrically connecting the PCB and the battery. The pen input device may include a buffer (e.g., the buffer 630 of FIG. 6) disposed in the rear opening. The pen input device may include a polymer (e.g., the polymer 800 of FIG. 8, the polymer 900 of FIG. 9, the first polymer 1010 of FIG. 10, or the second polymer 1020 of FIG. 10) filled in an inner space of the housing. The support may include a support plate (e.g., the support plate 510 of FIG. 5) extended in a direction toward the rear opening from the front opening of the housing, and further includes a first partition (e.g., the first partition 521 of FIG. 5), a second partition (e.g., the second partition 522 of FIG. 5), and a third partition (e.g., the third partition 523 of FIG. which are protruded from the support plate and sequentially spaced in the direction. The pen input generator may be combined with the first partition. The PCB may be disposed between the first partition and the second partition. The battery may be disposed between the second partition and the third partition. A stepped structure (e.g., the stepped structure 604 of FIG. 6) may be formed on an inner surface of the housing between the third partition and the buffer to prevent the buffer from moving toward the third partition. The at least one conductive member is disposed to penetrate an opening (e.g., the second opening 5221 of FIG. 8) formed in the second partition.

An example 2 of the present disclosure may provide a pen input device (e.g., the pen input device 220 of FIG. 3) in accordance with example 1, or with any other example described herein. In accordance with example 2, the polymer (e.g., the polymer 800 of FIG. 8, the polymer 900 of FIG. 9, or the second polymer 1020 of FIG. 10) may be filled at least in the opening (e.g., the second opening 5221 of FIG. 8) formed in the second partition (e.g., the second partition 522 of FIG. 8) and between the second partition and the battery (e.g., the battery 440 of FIG. 8).

An example 3 of the present disclosure may provide a pen input device (e.g., the pen input device 220 of FIG. 3) in accordance with example 1 or example 2, or with any other example described herein. In accordance with example 3, the polymer (e.g., the polymer 800 of FIG. 8, the polymer 900 of FIG. 9, or the second polymer 1020 of FIG. 10) may enclose the at least one conductive member (e.g., the conductive member 450 of FIG. 8).

An example 4 of the present disclosure may provide a pen input device (e.g., the pen input device 220 of FIG. 3) in accordance with any one of examples 1 to 3, or with any other example described herein. In accordance with example 4, the battery (e.g., the battery 440 of FIG. 6) may include a pouch (e.g., the pouch 441 of FIG. 8). In accordance with example 4, the battery may include an electrode assembly placed in the pouch and formed by rolling together a positive electrode substrate, a negative electrode substrate, and a separator disposed between the positive and negative electrode substrates. In accordance with example 4, the battery may include an electrolyte filled in the pouch. In accordance with example 4, the battery may include a cover (e.g., the cover 442 of FIG. 8) combined with the pouch to seal the pouch and disposed to face the second partition (e.g., the second partition 522 of FIG. 8). In accordance with example 4, the at least one conductive member may be extended out of the pouch from the electrode assembly.

An example 5 of the present disclosure may provide a pen input device (e.g., the pen input device 220 of FIG. 3) in accordance with any one of examples 1 to 4, or with any other example described herein. In accordance with example 5, the at least one conductive member (e.g., the conductive member 450 of FIG. 8) may be rigid.

An example 6 of the present disclosure may provide a pen input device (e.g., the pen input device 220 of FIG. 3) in accordance with any one of examples 1 to 5, or with any other example described herein. In accordance with example 6, the polymer (e.g., the polymer 800 of FIG. 8, the polymer 900 of FIG. 9, the first polymer 1010 of FIG. 10, or the second polymer 1020 of FIG. 10) may cover at least the PCB (e.g., the PCB 430 of FIG. 8).

An example 7 of the present disclosure may provide a pen input device (e.g., the pen input device 220 of FIG. 3) in accordance with any one of examples 1 to 6, or with any other example described herein. In accordance with example 7, the polymer the polymer 800 of FIG. 8, the polymer 900 of FIG. 9, or the second polymer 1020 of FIG. 10 may include a buffer material.

An example 8 of the present disclosure may provide a pen input device (e.g., the pen input device 220 of FIG. 3) in accordance with any one of examples 1 to 7, or with any other example described herein. In accordance with example 8, the pen input device further may include a fourth partition (e.g., the fourth partition 1001 of FIG. 10) disposed on one surface (e.g., the first surface 431 of FIG. 10) of the PCB (e.g., the PCB 430 of FIG. 10) between the first partition (e.g., the first partition 521 of FIG. 10) and the second partition (e.g., the second partition 522 of FIG. 10). In accordance with example 8, the polymer may include a first polymer (e.g., the first polymer 1010 of FIG. 10) disposed at least between the first partition and the fourth partition. In accordance with example 8, the polymer may include a second polymer (e.g., the second polymer 1020 of FIG. 10) disposed at least between the fourth partition and the battery (e.g., the battery 440 of FIG. 8).

An example 9 of the present disclosure may provide a pen input device (e.g., the pen input device 220 of FIG. 3) in accordance with any one of examples 1 to 8, or with any other example described herein. In accordance with example 9, the pen input device further may include a fifth partition (e.g., the fifth partition 1002 of FIG. 10) disposed on other surface (e.g. the second surface 432 of FIG. 10) of the PCB (e.g., the PCB 430 of FIG. 10) between the first partition (e.g., the first partition 521 of FIG. 10) and the second partition (e.g., the second partition 522 of FIG. 10). In accordance with example 9, the first polymer (e.g., the first polymer 1010 of FIG. 10) may be further disposed between the first partition and the fifth partition. In accordance with example 9, the second polymer (e.g., the second polymer 1020 of FIG. 10) may be further disposed between the second partition and the fifth partition.

An example 10 of the present disclosure may provide a pen input device (e.g., the pen input device 220 of FIG. 3) in accordance with any one of examples 1 to 9, or with any other example described herein. In accordance with example 10, the PCB may have an opening (e.g., the opening 1060 of FIG. 10 or FIG. 11) penetrating from the one surface (e.g., the first surface 431 of FIG. 10) to the other surface (e.g., the second surface 432 of FIG. 10) and connecting a space (e.g., the second space 1102 of FIG. 10) between the second partition (e.g., the second partition 522 of FIG. 10) and the fourth partition (e.g., the fourth partition 1001 of FIG. 10) and a space (e.g., the fourth space 1104 of FIG. 10) between the second partition and the fifth partition (e.g., the firth partition 1002 of FIG. 10). In accordance with example 10, a part of the second polymer (e.g., the second polymer 1020 of FIG. 10) may be disposed in the opening.

An example 11 of the present disclosure may provide a pen input device (e.g., the pen input device 220 of FIG. 3) in accordance with any one of examples 1 to 10, or with any other example described herein. In accordance with example 11, the first polymer (e.g., the first polymer 1010 of FIG. 10) may be harder than the second polymer (e.g., the second polymer 1020 of FIG. 10).

An example 12 of the present disclosure may provide a pen input device (e.g., the pen input device 220 of FIG. 3) in accordance with any one of examples 1 to 11, or with any other example described herein. In accordance with example 12, the first polymer (e.g., the first polymer 1020 of FIG. 10) may include epoxy.

An example 13 of the present disclosure may provide a pen input device (e.g., the pen input device 220 of FIG. 3) in accordance with any one of examples 1 to 12, or with any other example described herein. In accordance with example 13, the second polymer (e.g., the second polymer 1020 of FIG. 10) may include a thermal interface material (TIM).

An example 14 of the present disclosure may provide a pen input device (e.g., the pen input device 220 of FIG. 3) in accordance with any one of examples 1 to 13, or with any other example described herein. In accordance with example 14, the buffer (e.g., the buffer of FIG. 6) may be disposed to be spaced apart from the third partition (e.g., the third partition 523 of FIG. 6).

An example 15 of the present disclosure may provide a pen input device (e.g., the pen input device 220 of FIG. 3) in accordance with any one of examples 1 to 14, or with any other example described herein. In accordance with example 15, a center of gravity of the pen input device may be biased toward the buffer (e.g., the buffer 630 of FIG. 6) disposed opposite to the pen tip (e.g., the pen tip 421 of FIG. 6).

An example 16 of the present disclosure may provide a pen input device (e.g., the pen input device 220 of FIG. 3) in accordance with any one of examples 1 to 15, or with any other example described herein. In accordance with example 16, the pen input device further may include a temperature sensor (e.g., the temperature sensor 840 of FIG. 9 or the temperature sensor 1040 of FIG. 10) disposed on the PCB (e.g., the PCB 430 of FIG. 9 or FIG. 10) and covered by the polymer (e.g., the polymer 900 of FIG. 9 or the second polymer 1020 of FIG. 10). In accordance with example 16, the polymer may include a heat transfer material. In accordance with example 16, the temperature sensor detects a temperature of the battery through the polymer.

An example 17 of the present disclosure may provide a pen input device (e.g., the pen input device 1200 of FIG. 12, or the pen input device 220 of FIG. 3) in accordance with any one of examples 1 to 16, or with any other example described herein. In accordance with example 17, the pen input device further may include a first communication controller (e.g., the first communication controller 1230 of FIG. 12) for performing first wireless communication through the pen input generator (e.g., the pen tip sensor 1210 of FIG. 12). In accordance with example 17, the pen input device further may include at least one antenna (e.g., the antenna 1240 of FIG. 12, or the antenna 437 of FIG. 11). In accordance with example 17, the pen input device further may include a second communication controller (e.g., the second communication controller 1250 of FIG. 12) for performing second wireless communication through the at least one antenna. In accordance with example 17, the pen input device further may include a power manager (e.g., the power management controller 1220 of FIG. 12), In accordance with example 17, the power manager may be configured to block power of the battery from being transmitted to the second communication controller, based on a temperature of the battery (e.g., the battery 1260 of FIG. 12).

An example 18 of the present disclosure may provide a pen input device (e.g., the pen input device 1200 of FIG. 12, or the pen input device 220 of FIG. 3) in accordance with any one of examples 1 to 17, or with any other example described herein. In accordance with example 18, the power manager (e.g., the power management controller 1220 of FIG. 12) may be configured to block the power of the battery (e.g., the battery 1260 of FIG. 12) from being transmitted to the second communication controller (e.g., the second communication controller 1250 of FIG. 12) when the pen input device is separated from an external device (e.g., the host device 1202 of FIG. 12, or the electronic device 101 of FIG. 1) and when the temperature of the battery exceeds a threshold.

An example 19 of the present disclosure may provide a pen input device (e.g., the pen input device 1200 of FIG. 12, or the pen input device 220 of FIG. 3) in accordance with any one of examples 1 to 18, or with any other example described herein. In accordance with example 19, the power manager (e.g., the power management controller 1220 of FIG. 12) may be configured to exchange synchronously battery temperature information with an external device (e.g., the host device 1202, the electronic device 101 of FIG. 1, or the electronic device 200 of FIG. 2a) through the first wireless communication or the second wireless communication when the pen input device is combined with the external device and when a charging signal from the external device is detected through the first wireless communication. In accordance with example 19, the power management controller may be configured to block the charging signal from being transmitted to the battery (e.g., the battery 1260 of FIG. 12) and then block the power of the battery from being transmitted to the second communication controller (e.g., the second communication controller 1250 of FIG. 12) when the temperature of the battery included in the pen input device is greater by a threshold or more than a temperature of a battery included in the external device.

An example 20 of the present disclosure may provide a pen input device (e.g., the pen input device 1200, or the pen input device 220 of FIG. 3) in accordance with any one of examples 1 to 19, or with any other example described herein. In accordance with example 20, the power manager (e.g. the power management controller 1220 of FIG. 12) may be configured to exchange the battery temperature information with the external device (e.g., the host device 1202 of FIG. 12, the electronic device 102 of FIG. 1, or the electronic device 200 of FIG. 2a) through the first wireless communication after blocking the power of the battery (e.g., the battery 1260 of FIG. 12) from being transmitted to the second communication controller (e.g., the second communication controller 1250 of FIG. 12).

An example 21 of the present disclosure may provide a pen input device (e.g., the pen input device 220 of FIG. 3) in accordance with any one of examples 1 to 20, or with any other example described herein. In accordance with example 21, the power manager (e.g., the power management controller 1220 of FIG. 12) may be configured to apply the charging signal to the battery (e.g., the battery 1260 of FIG. 12) when the temperature of the battery included in the pen input device is not greater by the threshold or more than the temperature of the battery (e.g., the battery 189 of FIG. 1) included in the external device (e.g., the host device 1202 of FIG. 12, the electronic device 102 of FIG. 1, or the electronic device 200 of FIG. 2a).

An example 22 of the present disclosure may provide a pen input device (e.g., the pen input device 220 of FIG. 3, or the pen input device 1200 of FIG. 12). The pen input device may include a pen input generator (e.g. the pen tip sensor 1210 of FIG. 12) including a pen tip (e.g., the pen tip 1211 of FIG. 12) and generating a position signal and a pen pressure signal of the pen input device. The pen input device may include a first communication controller (e.g., the first communication controller 1230 of FIG. 12) for performing first wireless communication through the pen input generator. The pen input device may include at least one antenna (e.g., the antenna 1240 of FIG. 12, or the antenna 437 of FIG. 11). The pen input device may include a second communication controller (e.g., the second communication controller 1250 of FIG. 12) for performing second wireless communication through the at least one antenna. The pen input device may include a battery (e.g. the battery 1260 of FIG. 12, or the battery 440 of FIG. 6). The pen input device may include a temperature sensor (e.g., the temperature sensor 1270 of FIG. 12) for detecting a temperature of the battery. The pen input device may include a power management controller (e.g., the power management controller 1220 of FIG. 12) that electronically connected to the pen input generator, the first communication controller, the second communication controller, the battery, and the temperature sensor. The power manager may be configured to block power of the battery from being transmitted to the second communication controller, based on a temperature of the battery.

An example 23 of the present disclosure may provide a pen input device (e.g., the pen input device 220 of FIG. 3, or the pen input device 1200 of FIG. 12) in accordance with example 22, or with any other example described herein. In accordance with example 23, the power manager (e.g., the power management controller 1220 of FIG. 12) may be configured to block the power of the battery (e.g., the battery 1260 of FIG. 12) from being transmitted to the second communication controller (e.g., the second communication controller 1250 of FIG. 12) when the pen input device is separated from an external device (e.g., the host device 1202 of FIG. 12, the electronic device 101 of FIG. 1, or the electronic device 200 of FIG. 2a) and when the temperature of the battery exceeds a threshold.

An example 24 of the present disclosure may provide a pen input device (e.g., the pen input device 220 of FIG. 3, or the pen input device 1200 of FIG. 12) in accordance with example 22 or example 23, or with any other example described herein. In accordance with example 24, the power manager (e.g., the power management controller 1220 of FIG. 12) may be configured to exchange synchronously battery temperature information with an external device (e.g., the host device 1202, the electronic device 101 of FIG. 1, or the electronic device 200 of FIG. 2a) through the first wireless communication or the second wireless communication when the pen input device is combined with the external device and when a charging signal from the external device is detected through the first wireless communication. In accordance with example 24, the power management controller may be configured to block the charging signal from being transmitted to the battery (e.g., the battery 1260 of FIG. 12) and then block the power of the battery from being transmitted to the second communication controller (e.g., the second communication controller 1250 of FIG. 12) when the temperature of the battery included in the pen input device is greater by a threshold or more than a temperature of a battery included in the external device.

An example 25 of the present disclosure may provide a pen input device (e.g., the pen input device 220 of FIG. 3, or the pen input device 1200 of FIG. 12) in accordance with any one of examples 22 to 24, or with any other example described herein. In accordance with example 25, the power manager (e.g. the power management controller 1220 of FIG. 12) may be configured to exchange the battery temperature information with the external device (e.g., the host device 1202 of FIG. 12, the electronic device 102 of FIG. 1, or the electronic device 200 of FIG. 2a) through the first wireless communication after blocking the power of the battery (e.g., the battery 1260 of FIG. 12) from being transmitted to the second communication controller (e.g., the second communication controller 1250 of FIG. 12).

An example 26 of the present disclosure may provide a pen input device (e.g., the pen input device 220 of FIG. 3, or the pen input device 1200 of FIG. 12) in accordance with any one of examples 22 to 25, or with any other example described herein. In accordance with example 26, the power manager (e.g., the power management controller 1220 of FIG. 12) may be configured to apply the charging signal to the battery (e.g., the battery 1260 of FIG. 12) when the temperature of the battery included in the pen input device is not greater by the threshold or more than the temperature of the battery (e.g., the battery 189 of FIG. 1) included in the external device (e.g., the host device 1202 of FIG. 12, the electronic device 102 of FIG. 1, or the electronic device 200 of FIG. 2a).

An example 27 of the present disclosure may provide a pen input device (e.g., the pen input device 220 of FIG. 3, or the pen input device 1200 of FIG. 12) in accordance with any one of examples 22 to 26, or with any other example described herein. In accordance with example 27, the pen input device may include a polymer (e.g., the polymer 900, or the second polymer 1020 of FIG. 10) filled in an inner space of the pen input device. In accordance with example 27, the polymer may be extended from the temperature sensor (e.g., the temperature sensor 1270 of FIG. 12, the temperature sensor 840 of FIG. 9, or the temperature sensor 1040 of FIG. 10) to the battery. In accordance with example 27, the polymer may include a heat transfer material. In accordance with example 27, the temperature sensor detects a temperature of the battery (e.g., the battery 1260 of FIG. 12, the battery 440 of FIG. 9, or the battery 440 of FIG. 9) through the polymer.

An example 28 of the present disclosure may provide an operating method of a pen input device (e.g., the pen input device 220 of FIG. 3, or the pen input device 1200 of FIG. 12) that include a pen input generator (e.g. the pen tip sensor 1210 of FIG. 12) generating a position signal and a pen pressure signal of the pen input device, a first communication controller (e.g., the first communication controller 1230 of FIG. 12) for performing first wireless communication through the pen input generator, at least one antenna (e.g., the antenna 1240 of FIG. 12), a second communication controller (e.g., the second communication controller 1250 of FIG. 12) for performing second wireless communication through the at least one antenna, and a battery (e.g. the battery 1260 of FIG. 12). The operating method may include obtaining a temperature of the battery, and blocking power of the battery from being transmitted to the second communication controller, based on the temperature of the battery.

An example 29 of the present disclosure may provide an operating method of a pen input device (e.g., the pen input device 220 of FIG. 3, or the pen input device 1200 of FIG. 12) in accordance with example 28, or with any other example described herein. In accordance with example 29, when the pen input device is separated from an external device (e.g., the host device 1202 of FIG. 12, the electronic device 101 of FIG. 1, or the electronic device 200 of FIG. 2a) and when the temperature of the battery exceeds a threshold, the power of the battery (e.g., the battery 1260 of FIG. 12) is blocked the power of the battery (e.g., the battery 1260 of FIG. 12) to being transmitted to the second communication controller (e.g., the second communication controller 1250 of FIG. 12).

An example 30 of the present disclosure may provide an operating method of a pen input device (e.g., the pen input device 220 of FIG. 3, or the pen input device 1200 of FIG. 12) in accordance with example 28 or example 29, or with any other example described herein. In accordance with example 30, the operating method may include exchanging synchronously battery temperature information with an external device (e.g., the host device 1202, the electronic device 101 of FIG. 1, or the electronic device 200 of FIG. 2a) through the first wireless communication or the second wireless communication when the pen input device is combined with the external device and when a charging signal from the external device is detected through the first wireless communication. In accordance with example 30, the operating method may include blocking the charging signal from being transmitted to the battery (e.g., the battery 1260 of FIG. 12) and then blocking the power of the battery from being transmitted to the second communication controller (e.g., the second communication controller 1250 of FIG. 12) when the temperature of the battery included in the pen input device is greater by a threshold or more than a temperature of a battery included in the external device.

An example 31 of the present disclosure may provide an operating method of a pen input device (e.g., the pen input device 220 of FIG. 3, or the pen input device 1200 of FIG. 12) in accordance with any one of examples 28 to 30, or with any other example described herein. In accordance with example 31, the operating method further may include exchanging the battery temperature information with the external device (e.g., the host device 1202 of FIG. 12, the electronic device 102 of FIG. 1, or the electronic device 200 of FIG. 2a) through the first wireless communication after blocking the power of the battery (e.g., the battery 1260 of FIG. 12) from being transmitted to the second communication controller (e.g., the second communication controller 1250 of FIG. 12).

An example 32 of the present disclosure may provide an operating method of a pen input device (e.g., the pen input device 220 of FIG. 3, or the pen input device 1200 of FIG. 12) in accordance with any one of examples 28 to 31, or with any other example described herein. In accordance with example 32, the operating method further include applying the charging signal to the battery (e.g., the battery 1260 of FIG. 12) when the temperature of the battery included in the pen input device is not greater by the threshold or more than the temperature of the battery included in the external device (e.g., the host device 1202 of FIG. 12, the electronic device 102 of FIG. 1, or the electronic device 200 of FIG. 2a).

The described embodiments of the disclosure merely present specific examples to easily describe and understand the technical content of the disclosure, and are not intended to limit the scope of the disclosure. Therefore, the scope of the disclosure should be construed to include all modified or modified forms derived based on the subject matter of the disclosure in addition to the embodiments disclosed herein.

The scope of protection is defined by the appended independent claims. Further features are specified by the appended dependent claims. Example implementations can be realized comprising one or more features of any claim taken jointly and severally in any and all permutations.

The examples described in this disclosure include non-limiting example implementations of components corresponding to one or more features specified by the appended independent claims and these features (or their corresponding components) either individually or in combination may contribute to ameliorating one or more technical problems deducible by the skilled person from this disclosure.

Furthermore, one or more selected component of any one example described in this disclosure may be combined with one or more selected component of any other one or more example described in this disclosure, or alternatively may be combined with features of an appended independent claim to form a further alternative example.

Further example implementations can be realized comprising one or more components of any herein described implementation taken jointly and severally in any and all permutations. Yet further example implementations may also be realized by combining features of one or more of the appended claims with one or more selected components of any example implementation described herein.

In forming such further example implementations, some components of any example implementation described in this disclosure may be omitted. The one or more components that may be omitted are those components that the skilled person would directly and unambiguously recognize as being not, as such, indispensable for the function of the present technique in the light of a technical problem discernible from this disclosure. The skilled person would recognize that replacement or removal of such an omitted components does not require modification of other components or features of the further alternative example to compensate for the change. Thus further example implementations may be included, according to the present technique, even if the selected combination of features and/or components is not specifically recited in this disclosure.

Two or more physically distinct components in any described example implementation of this disclosure may alternatively be integrated into a single component where possible, provided that the same function is performed by the single component thus formed. Conversely, a single component of any example implementation described in this disclosure may alternatively be implemented as two or more distinct components to achieve the same function, where appropriate.

According to the above-described embodiments, a pen input device may utilize battery power while protecting a battery or a related power system from an external impact or external pressure. The pen input device may also reduce an injury to a user by buffering an explosion of a battery. A pen input device operating method may also prevent a battery explosion in advance based on a temperature of a battery.

While the disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

The invention claimed is:
1. A pen input device comprising:
a tubular housing including a front opening and a rear opening disposed opposite to each other;
a pen input generator including a pen tip disposed in the front opening, and the pen input generator generating a position signal and a pen pressure signal of the pen input device;
a battery;
a printed circuit board (PCB) disposed between the pen input generator and the battery, and the PCB being electrically connected to the pen input generator and the battery;
a support on which at least a part of the pen input generator, the battery, and the PCB are disposed;
a conductive part electrically connecting the PCB and the battery;
a buffer disposed in the rear opening; and
a polymer that fills in an inner space of the housing,
wherein the support includes:

a support plate extended in a direction toward the rear opening from the front opening of the housing, and a first partition, a second partition, and a third partition, which protrude from the support plate and are sequentially spaced in the direction, wherein the pen input generator is combined with the first partition, the PCB is disposed between the first partition and the second partition, and the battery is disposed between the second partition and the third partition, wherein a stepped structure is formed on an inner surface of the housing between the third partition and the buffer and prevents the buffer from moving toward the third partition, wherein the conductive part penetrates an opening formed in the second partition, and wherein the battery comprises:
a pouch;
an electrode assembly in the pouch, and the electrode assembly being formed by rolling together a positive electrode substrate, a negative electrode substrate, and a separator disposed between the positive and negative electrode substrates;
an electrolyte that fills in the pouch; and
a cover that seals the pouch and faces the second partition, and wherein the conductive part extends out of the pouch from the electrode assembly.

2. The pen input device of claim 1, wherein the polymer fills at least the opening formed in the second partition and between the second partition and the battery.

3. The pen input device of claim 1, wherein the polymer encloses the conductive part.

4. The pen input device of claim 1, wherein the conductive part is rigid.

5. The pen input device of claim 1, wherein the polymer covers at least a portion of the PCB.

6. The pen input device of claim 1, wherein the polymer includes a buffer material.

7. The pen input device of claim 1, wherein the pen input device further comprises a fourth partition disposed on a first surface of the PCB between the first partition and the second partition, and
wherein the polymer includes:
a first polymer disposed between the first partition and the fourth partition; and
a second polymer disposed between the fourth partition and the battery.

8. The pen input device of claim 7, further comprising:
a fifth partition disposed on a second surface of the PCB between the first partition and the second partition,
wherein the first polymer is further disposed between the first partition and the fifth partition, and the second polymer is further disposed between the second partition and the fifth partition.

9. The pen input device of claim 8, wherein the PCB has an opening penetrating from the one surface to the other surface and connecting a space between the second partition and the fourth partition and a space between the second partition and the fifth partition, and
wherein a part of the second polymer is disposed in the opening.

10. The pen input device of claim 7, wherein the first polymer is harder than the second polymer.

11. The pen input device of claim 7, wherein the first polymer includes epoxy.

12. The pen input device of claim 7, wherein the second polymer includes a thermal interface material (TIM).

13. The pen input device of claim 1, wherein the buffer is spaced apart from the third partition.

14. The pen input device of claim 1, wherein a center of gravity of the pen input device is biased toward the buffer disposed opposite to the pen tip.

15. The pen input device of claim 1, further comprising a temperature sensor disposed on the PCB and covered by the polymer,
wherein the polymer includes a heat transfer material, and
wherein the temperature sensor detects a temperature of the battery through the polymer.

16. The pen input device of claim 1, further comprising:
a first communication circuitry configured to perform first wireless communication through the pen input generator;
an antenna;
a second communication circuitry configured to perform second wireless communication through the antenna; and
a power managing circuitry, wherein the power managing circuitry is configured to block power of the battery from being transmitted to the second communication circuitry, based on a temperature of the battery.

17. The pen input device of claim 16, wherein the power managing circuitry is configured to block the power of the battery from being transmitted to the second communication circuitry when the pen input device is separated from an external device and when the temperature of the battery exceeds a threshold.

18. The pen input device of claim 16, wherein the power managing circuitry is configured to:
exchange battery temperature information with an external device through the first wireless communication or the second wireless communication when the pen input device is combined with the external device and when a charging signal from the external device is detected through the first wireless communication, and
block the charging signal from being transmitted to the battery and block the power of the battery from being transmitted to the second communication circuitry when the temperature of the battery included in the pen input device is greater than or equal to a threshold based on a temperature of a battery included in the external device.

19. The pen input device of claim 18, wherein the power managing circuitry is configured to exchange the battery temperature information with the external device through the first wireless communication after blocking the power of the battery from being transmitted to the second communication circuitry.

20. The pen input device of claim 18, wherein the power managing circuitry is configured to apply the charging signal to the battery when the temperature of the battery included in the pen input device is less than the threshold based on the temperature of the battery included in the external device.

* * * * *